(12) United States Patent
Park et al.

(10) Patent No.: US 11,580,910 B2
(45) Date of Patent: Feb. 14, 2023

(54) DISPLAY DEVICE

(71) Applicant: Samsung Display Co., LTD., Yongin-si (KR)

(72) Inventors: Yong Sung Park, Seoul (KR); Hyun Woo Kim, Cheonan-si (KR); Dae Hyun Noh, Hwaseong-si (KR); Seung Bin Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/208,648

(22) Filed: Mar. 22, 2021

(65) Prior Publication Data

US 2021/0327362 A1  Oct. 21, 2021

(30) Foreign Application Priority Data

Apr. 20, 2020  (KR) .................. 10-2020-0047299

(51) Int. Cl.
*G09G 3/32* (2016.01)
*G09G 3/3266* (2016.01)
(Continued)

(52) U.S. Cl.
CPC ......... *G09G 3/3266* (2013.01); *G09G 3/3233* (2013.01); *H01L 27/3248* (2013.01); *G09G 2300/0413* (2013.01); *G09G 2300/0426* (2013.01); *G09G 2300/0809* (2013.01); *G09G 2310/0202* (2013.01); *G09G 2310/0243* (2013.01); *G09G 2310/08* (2013.01);
(Continued)

(58) Field of Classification Search
CPC ............... G09G 3/3266; G09G 3/3233; G09G 2300/0413; G09G 2300/0426; G09G 2300/0809; G09G 2310/0202; G09G 2310/0243; G09G 2310/08; G09G 2320/0233; H01L 27/3248; H01L 51/0097; H01L 2251/5338
See application file for complete search history.

(56) References Cited

U.S. PATENT DOCUMENTS

| 2016/0189644 | A1* | 6/2016 | So ................ G09G 3/3233 345/205 |
| 2018/0342194 | A1* | 11/2018 | Li ................ G09G 3/3677 |
| 2018/0366066 | A1* | 12/2018 | Kim ................ G09G 3/3677 |

FOREIGN PATENT DOCUMENTS

| CN | 102640386 A | * | 8/2012 | ............ H01M 10/44 |
| KR | 20160055506 A | * | 5/2016 | ........... G09G 3/3275 |

(Continued)

*Primary Examiner* — Towfiq Elahi
(74) *Attorney, Agent, or Firm* — Kile Park Reed & Houtteman PLLC

(57) ABSTRACT

A display device includes a display panel including a first display area; a second display area protruding in a first direction from the first display area; and a first non-display area adjacent to a side of the second display area. Each of the first display area and the second display area includes subpixels that display an image and scan lines electrically connected to the subpixels. The first non-display area includes dummy pixels; a common scan line electrically connected to the dummy pixels; load matching switch elements respectively disposed between the scan lines and the common scan line; and a load matching driving circuit that outputs load matching control signals to control turn-on and turn-off of the load matching switch elements.

20 Claims, 19 Drawing Sheets

(51) Int. Cl.
  *H01L 27/32* (2006.01)
  *G09G 3/3233* (2016.01)
  *H01L 51/00* (2006.01)

(52) U.S. Cl.
  CPC .. *G09G 2320/0233* (2013.01); *H01L 51/0097* (2013.01); *H01L 2251/5338* (2013.01)

(56) References Cited

FOREIGN PATENT DOCUMENTS

| | | |
|---|---|---|
| KR | 10-2019-0050331 | 5/2019 |
| KR | 10-2019-0114066 | 10/2019 |

\* cited by examiner

DISPLAY DEVICE

CROSS-REFERENCE TO RELATED APPLICATION(S)

This application claims priority to and benefits of Korean Patent Application No. 10-2020-0047299 under 35 U.S.C. § 119, filed on Apr. 20, 2020 in the Korean Intellectual Property Office, the entire contents of which are incorporated herein by reference for all purposes as if fully set forth herein.

BACKGROUND

1. Technical Field

Embodiments relate generally to a display device.

2. Description of the Related Art

As the information society develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and light emitting display devices.

A display device may include a display panel which has a display area displaying an image and a non-display area not displaying an image and various sensor devices which sense light such as a camera sensor, an illuminance sensor and an infrared sensor. In the display area of the display panel, scan lines to which scan signals may be transmitted, data lines to which data voltages may be applied, and pixels which may be electrically connected to the scan lines and the data lines may be formed. Here, the display area of the display panel may be formed not to overlap the sensor devices. Thus, a side of the display area of the display panel may include a concavely recessed notch in a part thereof in a case that a side of the display area of the display panel may be seen in plan view. In this case, a different number of pixels may be electrically connected to each scan line, and a different load may be applied to each scan line. This may cause a difference in a pulse width of a scan signal for each scan line and a difference in luminance between pixels.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device which may minimize a difference between loads of scan lines.

Additional features will be set forth in the description which follows, and in part will be apparent from the description, or may be learned by practice of the disclosure.

A display device according to an embodiment may include a display panel which may include a first display area; a second display area protruding in a first direction from the first display area; and a first non-display area adjacent to a side of the second display area. Each of the first display area and the second display area may include subpixels that display an image and scan lines electrically connected to the subpixels. The first non-display area may include dummy pixels; a common scan line electrically connected to the dummy pixels; load matching switch elements respectively disposed between the scan lines and the common scan line; and a load matching driving circuit that outputs load matching control signals to control turn-on and turn-off of the load matching switch elements.

An area of the second display area may be smaller than an area of the first display area.

Each of the load matching switch elements may include a gate electrode electrically connected to one of load matching control lines to which the load matching control signals are output; a first electrode electrically connected to one of the scan lines; and a second electrode electrically connected to the common scan line.

The display panel may further include a second non-display area adjacent to another side of the second display area, and the second non-display area may include a scan driving circuit that outputs scan signals to the scan lines.

The scan signals and the load matching control signals may be sequentially output.

The scan signals and the load matching control signals may be output in synchronization with each other.

A pulse width of one of the scan signals may be equal to a pulse width of one of the load matching control signals.

The display device may further include a display driver that outputs a scan start signal and scan clock signals to the scan driving circuit and outputs a load matching start signal and load matching clock signals to the load matching driving circuit, wherein the scan driving circuit may output the scan signals in response to the scan start signal and the scan clock signals, the load matching driving circuit may output the load matching control signals in response to the load matching start signal and the load matching clock signals, and the scan clock signals and the load matching clock signals may be identical.

The scan start signal and the load matching start signal may be different.

A pulse width of one of the scan signals may be smaller than a pulse width of one of the load matching control signals.

The display device may further include a display driver that outputs a scan start signal and scan clock signals to the scan driving circuit and outputs a load matching start signal and load matching clock signals to the load matching driving circuit, wherein the scan driving circuit may output the scan signals in response to the scan start signal and the scan clock signals, the load matching driving circuit may output the load matching control signals in response to the load matching start signal and the load matching clock signals, and the scan clock signals and the load matching clock signals may be different.

The scan start signal and the load matching start signal may be different.

A display device according to an embodiment may include a display panel which may include a first display area; a second display area protruding in a first direction from the first display area; and a first non-display area adjacent to a side of the second display area. Each of the first display area and the second display area may include subpixels that display an image and scan lines and emission lines electrically connected to the subpixels. The first non-display area may include first dummy pixels and second dummy pixels; a first common scan line electrically connected to the first dummy pixels; a second common scan line electrically connected to the second dummy pixels; first load matching switch elements respectively disposed between a predetermined number of the scan lines and the first common scan line; second load matching switch elements respectively disposed between other ones of the scan lines and the second common scan line; and a load matching driving circuit that outputs load matching control signals to control turn-on and turn-off of the first load matching switch elements and the second load matching switch elements.

A first load matching switch element and a second load matching switch element adjacent to each other among the first load matching switch elements and the second load matching switch elements may be electrically connected to one of load matching control lines to which the load matching control signals may be output.

The display panel may further include a second non-display area adjacent to another side of the second display area, and the second non-display area may include a scan driving circuit that outputs scan signals to the scan lines; and an emission driving circuit that outputs emission signals to the emission lines.

The scan signals, the emission signals, and the load matching control signals may be sequentially output.

The emission signals and the load matching control signals may be output in synchronization with each other.

A pulse width of one of the emission signals may be equal to a pulse width of one of the load matching control signals.

The display device may further include a display driver that outputs an emission start signal and emission clock signals to the emission driving circuit and outputs a load matching start signal and load matching clock signals to the load matching driving circuit, wherein the emission driving circuit may output the emission signals in response to the emission start signal and the emission clock signals, the load matching driving circuit may output the load matching control signals in response to the load matching start signal and the load matching clock signals, and the emission clock signals and the load matching clock signals may be identical.

The emission start signal and the load matching start signal may be different.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments, and together with the description serve to explain the disclosure in conjunction with the accompanying drawings in which.

DETAILED DESCRIPTION OF EMBODIMENTS

Figure 1:
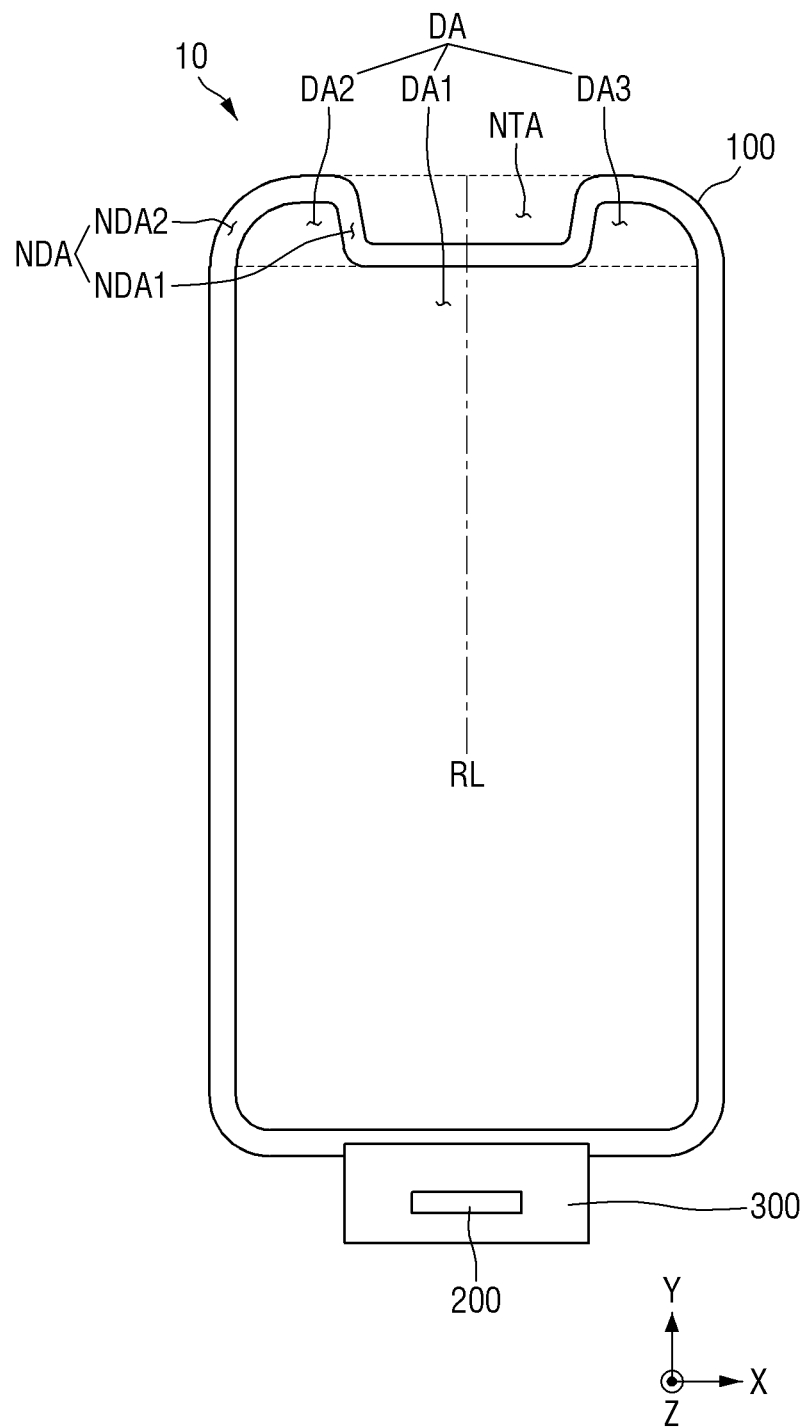
FIG. 1 is a plan view of a display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the concepts disclosed herein. It is apparent, however, that various embodiments may be practiced without these specific details or with one or more equivalent arrangements. In other instances, other structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the disclosure.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise specified, the illustrated embodiments are to be understood as providing features of varying detail of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z axes, and may be interpreted in a broader sense. For example, the D1-axis, the D2-axis, and the D3-axis may be perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing embodiments and is not intended to be limiting. As used herein, the singular forms, "a," "an," and "the" are intended to include the plural forms as well, unless the context clearly indicates otherwise.

Moreover, the terms "comprises," "comprising," "includes," and/or "including," "have" and/or "having" when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device 10 according to an embodiment.

Referring to FIG. 1, the display device 10 according to an embodiment may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). Alternatively, the display device 10 according to an embodiment may be applied as a display unit of a television, a notebook computer, a monitor, a billboard, or the Internet of things (IoT). Alternatively, the display device 10 according to an embodiment may be applied to wearable devices such as smart watches, watch phones, glass-like displays, and head-mounted displays (HMDs). Alternatively, the display device 10 according to an embodiment may be applied to a dashboard of a vehicle, a center fascia of a vehicle, a center information display (CID) disposed on a dashboard of a vehicle, a room mirror display in place of a side mirror of a vehicle, or a display disposed on the back of a front seat as an entertainment for a rear seat of a vehicle.

The display device 10 according to an embodiment may include a display panel 100, a display driver 200, and a display circuit board 300.

The display panel 100 may include a display area DA and a non-display area NDA. The display area DA is an area that may include pixels and displays an image. The non-display area NDA is an area that does not include pixels and does not display an image.

The display area DA may include a first display area DA1, a second display area DA2, and a third display area DA3. At least two of the first display area DA1, the second display area DA2, and the third display area DA3 may have different areas. For example, the first display area DA1 may have a larger area than the second display area DA2 and the third display area DA3 as illustrated in FIG. 1. At least two of the first display area DA1, the second display area DA2, and the third display area DA3 may have the same area. For example, the second display area DA2 and the third display area DA3 may have the same area as illustrated in FIG. 1. However, the areas of the first display area DA1, the second display area DA2 and the third display area DA3 of the display panel 100 are not limited to those illustrated in FIG. 1. For example, the first display area DA1, the second display area DA2, and the third display area DA3 may also have different areas.

The first display area DA1 may occupy most of the area of the display panel 100. The first display area DA1 may have a substantially quadrangular planar shape having short sides in a first direction (X-axis direction) and long sides in a second direction (Y-axis direction). In the first display area DA1, a corner where any two sides meet may be rounded or right-angled. For example, an upper left corner and an upper right corner of the first display area DA1 may be right-angled, whereas a lower left corner and a lower right corner of the first display area DA1 are rounded. Alternatively, the substantially planar shape of the first display area DA1 may be another polygonal shape other than a substantially quadrangle, a substantially circular shape, a substantially oval shape, or an atypical shape.

The second display area DA2 may protrude in the second direction (Y-axis direction) from a part of the first display area DA1. A lower side of the second display area DA2 may correspond to a part of an upper side of the first display area DA1. A left side of the second display area DA2 may extend from a left side of the first display area DA1. The second display area DA2 may have an atypical shape.

A maximum length of the second display area DA2 in the first direction (X-axis direction) may be smaller than a maximum length of the first display area DA1 in the first direction (X-axis direction). A maximum length of the second display area DA2 in the second direction (Y-axis direction) may be smaller than a maximum length of the first display area DA1 in the second direction (Y-axis direction).

The third display area DA3 may protrude in the second direction (Y-axis direction) from another part of the first display area DA1. A lower side of the third display area DA3 may correspond to another part of the upper side of the first display area DA1. A right side of the third display area DA3 may extend from a right side of the first display area DA1. The third display area DA3 may have an atypical shape.

A maximum length of the third display area DA3 in the first direction (X-axis direction) may be smaller than the maximum length of the first display area DA1 in the first direction (X-axis direction). A maximum length of the third display area DA3 in the second direction (Y-axis direction) may be smaller than the maximum length of the first display area DA1 in the second direction (Y-axis direction).

The second display area DA2 and the third display area DA3 may be spaced apart from each other in the first direction (X-axis direction). The second display area DA2 and the third display area DA3 may be symmetrical to each other with respect to a reference line RL drawn in the second direction (Y-axis direction) in the middle of the display panel 100. Therefore, a notch NTA (or a cut part) may be formed between the second display area DA2 and the third display area DA3 of the display panel 100. The notch NTA may be an area formed by cutting or removing a part of the display panel 100.

Since the second display area DA2 and the third display area DA3 are symmetrical to each other with respect to the reference line RL, the maximum length of the second display area DA2 in the first direction (X-axis direction) may be substantially equal to the maximum length of the third display area DA3 in the first direction (X-axis direction). The maximum length of the second display area DA2 in the second direction (Y-axis direction) may be substantially equal to the maximum length of the third display area DA3 in the second direction (Y-axis direction).

The non-display area NDA is an area that does not include pixels and does not display an image. The non-display area NDA may include a first non-display area NDA1 which is adjacent to the notch NTA and a second non-display area NDA2 which is the remaining area excluding the first non-display area NDA1.

The first non-display area NDA1 may be disposed on a left side, a lower side and a right side of the notch NTA. The first non-display area NDA1 may be disposed on a right side of the second display area DA2, a part of the upper side of the first display area DA1, and a left side of the third display area DA3. The first non-display area NDA1 may include a first load matching driving circuit 130 and a second load matching driving circuit 140.

The second non-display area NDA2 may be disposed on the left sides of the first display area DA1 and the second display area DA2. The second non-display area NDA2 may be disposed on the right sides of the first display area DA1 and the third display area DA3. The second non-display area NDA2 may be disposed on an upper side of the second display area DA2 and an upper side of the third display area DA3. The second non-display area NDA2 may be disposed on a lower side of the first display area DA1.

In a case that the notch NTA is disposed at an edge of the display panel 100, the display circuit board 300 may be disposed at the other edge of the display panel 100. For example, in a case that the notch NTA is disposed at an upper edge of the display panel 100, the display circuit board 300 may be disposed at a lower edge of the display panel 100.

The display circuit board 300 may be bent toward a lower surface of the display panel 100. In this case, the display circuit board 300 may be attached and fixed to the lower surface of the display panel 100 through an adhesive member. The adhesive member may be a pressure sensitive adhesive. Alternatively, the display circuit board 300 may be omitted, and an edge of the display panel 100 may be bent toward the lower surface of the display panel 100.

The display circuit board 300 may be attached onto display pads DP (see FIG. 2) of the display panel 100 by using an anisotropic conductive film. Therefore, the display circuit board 300 may be electrically connected to the display pads DP (see FIG. 2) of the display panel 100. The display circuit board 300 may be a flexible printed circuit board, a printed circuit board, or a flexible film such as a chip on film.

The display driver 200 outputs signals and voltages for driving the display panel 100. The display drier 200 may be formed as an integrated circuit and attached onto the display circuit board 300. Alternatively, the display driver 200 may be directly attached onto the display panel 100 using a chip-on-glass (COG) method, a chip-on-plastic (COP) method, or an ultrasonic bonding method.

Since the display device 10 may include the notch NTA formed by cutting or removing a part of the display panel 100 as illustrated in FIG. 1, various sensor devices that sense light may be disposed in the notch NTA instead of the non-display area NDA of the display device 10. Therefore, a bezel area corresponding to the non-display area NDA of the display device 10 may be reduced. The various sensor devices may be sensors that sense light, such as a camera sensor, an illuminance sensor, an infrared sensor, and a proximity sensor.

Figure 2:
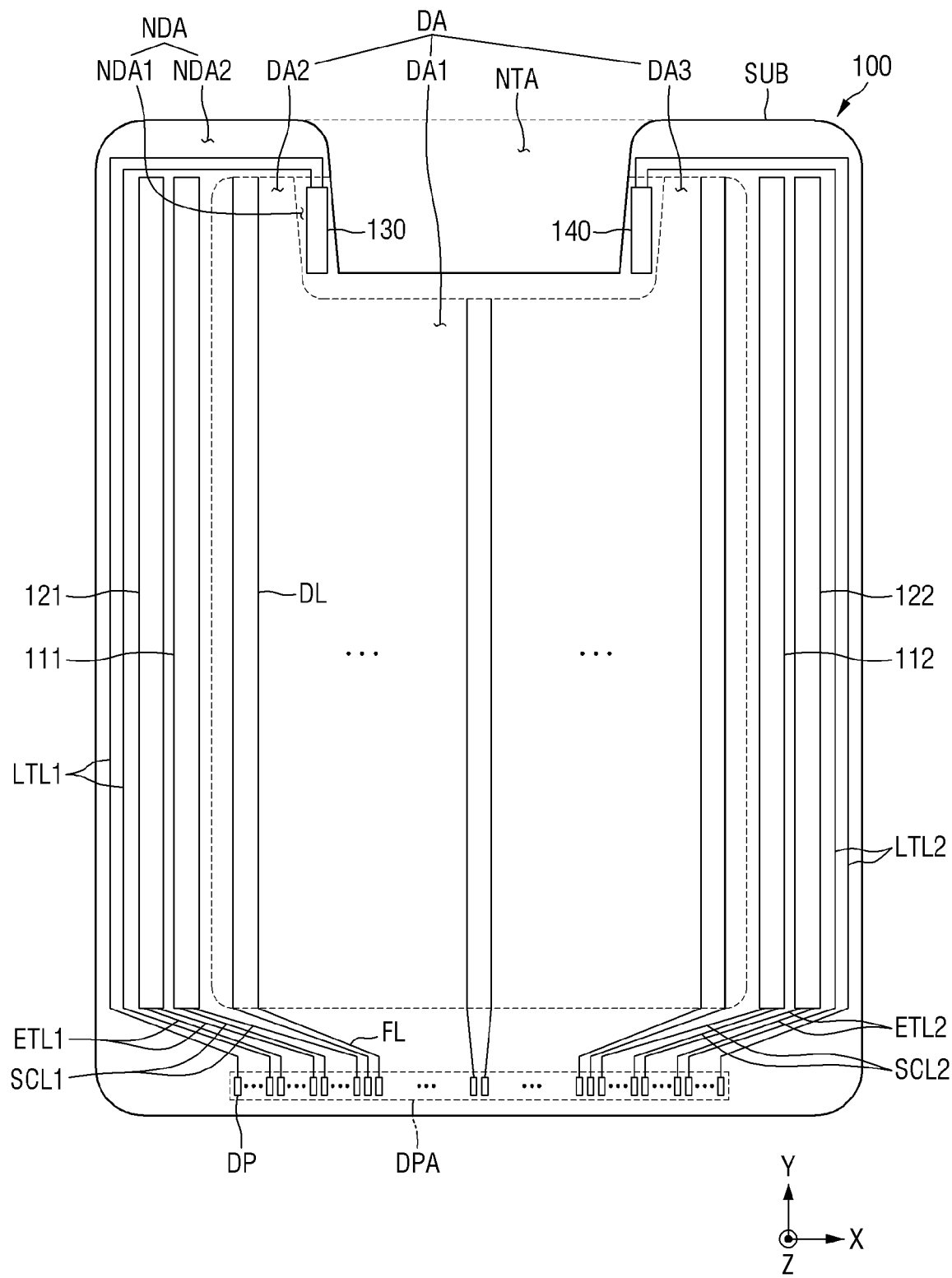
FIG. 2 is a layout view of a display panel according to an embodiment.

FIG. 2 is a layout view of the display panel 100 according to an embodiment.

Referring to FIG. 2, the display panel 100 may include the display area DA, the non-display area NDA, a first scan driving circuit 111, a second scan driving circuit 112, the first scan driving circuit 111 and the second scan driving circuit 112 may be collectively referred to as a scan driving circuit, a first emission driving circuit 121, a second emission driving circuit 122, the first load matching driving circuit 130, the second load matching driving circuit 140, the display pads DP, fan-out lines FL, data lines DL, first scan timing lines SCL1, second scan timing lines SCL2, first emission timing lines ETL1, second emission timing lines ETL2, first load timing lines LTL1, and second load timing lines LTL2.

A scan driving circuit may include the first scan driving circuit 111 and the second scan driving circuit 112. The first scan driving circuit 111 and the second scan driving circuit 112 may be disposed in the second non-display area NDA2. The first scan driving circuit 111 may be disposed on the left side of the first display area DA1 and the left side of the second display area DA2, and the second scan driving circuit 112 may be disposed on the right side of the first display area DA1 and the right side of the third display area DA3.

The first scan driving circuit 111 may be electrically connected to the first scan timing lines SCL1, and the second scan driving circuit 112 may be electrically connected to the second scan timing lines SCL2. The first scan timing lines SCL1 and the second scan timing lines SCL2 may be electrically connected to the display pads DP, and the display pads DP may be electrically connected to the display circuit board 300. Therefore, the first scan driving circuit 111 and the second scan driving circuit 112 may be electrically connected to the display driver 200 of the display circuit board 300.

The first scan driving circuit 111 may generate scan signals based on first scan timing signals received from the display driver 200. The first scan driving circuit 111 may output the scan signals to scan lines GIL, GWL and GBL (see FIG. 3) of the first display area DA1 and the second display area DA2.

The second scan driving circuit 112 may generate scan signals based on second scan timing signals received from the display driver 200. The second scan driving circuit 112 may output the scan signals to scan lines GIL, GWL and GBL (see FIG. 3) of the first display area DA1 and the third display area DA3.

An emission driving circuit may include the first emission driving circuit 121 and the second emission driving circuit 122. The first emission driving circuit 121 and the second emission driving circuit 122 may be disposed in the second non-display area NDA2. The first emission driving circuit 121 may be disposed on a left side of the first scan driving circuit 111, and the second emission driving circuit 122 may be disposed on a right side of the second scan driving circuit 112.

The first emission driving circuit 121 may be electrically connected to the first emission timing lines ETL1, and the second emission driving circuit 122 may be electrically connected to the second emission timing lines ETL2. The first emission timing lines ETL1 and the second emission timing lines ETL2 may be electrically connected to the display pads DP, and the display pads DP may be electrically connected to the display circuit board 300. Therefore, the first emission driving circuit 121 and the second emission driving circuit 122 may be electrically connected to the display driver 200 of the display circuit board 300.

The first emission driving circuit 121 may generate emission signals based on first emission timing signals received from the display driver 200. The first emission driving circuit 121 may output the emission signals to emission lines EL (see FIG. 3) of the first display area DA1 and the second display area DA2.

The second emission driving circuit 122 may generate emission signals based on second emission timing signals received from the display driver 200. The second emission driving circuit 122 may output the emission signals to emission lines EL (see FIG. 3) of the first display area DA1 and the third display area DA3.

The first load matching driving circuit 130 may be disposed in the first non-display area NDA1. The first load matching driving circuit 130 may be disposed on the right side of the second display area DA2. The first load matching driving circuit 130 may be electrically connected to the first load timing lines LTL1. The first load timing lines LTL1 may be disposed on a left side of the first emission driving circuit 121 and the upper side of the second display area DA2. The first load timing lines LTL1 may be electrically connected to the display pads DP, and the display pads DP may be electrically connected to the display circuit board 300. Therefore, the first load matching driving circuit 130 may be electrically connected to the display driver 200 of the display circuit board 300.

The first load matching driving circuit 130 may generate load matching control signals based on first load timing signals received from the display driver 200. The first load matching driving circuit 130 may output the load matching control signals to load matching control lines LCL (see FIG. 3) of the first non-display area NDA1.

The second load matching driving circuit 140 may be disposed in the first non-display area NDA1. The second load matching driving circuit 140 may be disposed on the left side of the third display area DA3. The second load matching driving circuit 140 may be electrically connected to the second load timing lines LTL2. The second load timing lines LTL2 may be disposed on a right side of the second emission driving circuit 122 and the upper side of the third display area DA3. The second load timing lines STL2 may be electrically connected to the display pads DP, and the display pads DP may be electrically connected to the display circuit board 300. Therefore, the second load matching driving circuit 140 may be electrically connected to the display driver 200 of the display circuit board 300.

The second load matching driving circuit 140 may generate load matching control signals based on second load timing signals received from the display driver 200. The second load matching driving circuit 140 may output the load matching control signals to load matching control lines LCL (see FIG. 3) of the second non-display area NDA2.

Since the first scan timing lines SCL1 are disposed between the display pads DP and the first scan driving circuit 111, the first scan timing signals, a gate-on voltage and a gate-off voltage of the display driver 200 may be applied to the first scan driving circuit 111 through the first scan timing lines SCL1. For example, the first scan timing signals may include a first scan start signal and first scan clock signals. The first scan timing lines SCL1 may include a first scan start signal line to which the first scan start signal is transmitted, first scan clock lines to which the first scan clock signals are transmitted, a gate-on voltage line to which the gate-on voltage is applied, and a gate-off voltage line to which the gate-off voltage is applied.

Since the second scan timing lines SCL2 are disposed between the display pads DP and the second scan driving circuit 112, the second scan timing signals, the gate-on voltage and the gate-off voltage of the display driver 200 may be applied to the second scan driving circuit 112 through the second scan timing lines SCL2. For example, the second scan timing signals may include a second scan start signal and second scan clock signals. The second scan timing lines SCL2 may include a second scan start signal line to which the second scan start signal is transmitted, second scan clock lines to which the second scan clock signals are transmitted, and a gate-on voltage line, and a gate-off voltage line.

Since the first emission timing lines ETL1 are disposed between the display pads DP and the first emission driving circuit 121, the first emission timing signals, the gate-on voltage and the gate-off voltage of the display driver 200 may be applied to the first emission driving circuit 121 through the first emission timing lines ETL1. For example, the first emission timing signals may include a first emission start signal and first emission clock signals. The first emission timing lines ETL1 may include a first emission start signal line to which the first emission start signal is transmitted, first emission clock lines to which the first emission clock signals are transmitted, a gate-on voltage line, and a gate-off voltage line.

Since the second emission timing lines ETL2 are disposed between the display pads DP and the second emission driving circuit 122, the second emission timing signals, the gate-on voltage and the gate-off voltage of the display driver 200 may be applied to the second emission driving circuit 122 through the second emission timing lines ETL2. For example, the second emission timing signals may include a second emission start signal and second emission clock signals. The second emission timing lines ETL2 may include a second emission start signal line to which the second emission start signal is transmitted, second emission clock lines to which the second emission clock signals are transmitted, a gate-on voltage line, and a gate-off voltage line.

Since the first load timing lines LTL1 are disposed between the display pads DP and the first load matching driving circuit 130, the first load timing signals, the gate-on voltage and the gate-off voltage of the display driver 200 may be applied to the first emission driving circuit 121 through the first load timing lines LTL1. For example, the first load timing signals may include a first load matching start signal and first load matching clock signals. The first load timing lines LTL1 may include a first load matching start signal line to which the first load matching start signal is transmitted, first load matching clock lines to which the first load matching clock signals are transmitted, a gate-on voltage line, and a gate-off voltage line.

Since the second load timing lines LTL2 are disposed between the display pads DP and the second load matching driving circuit 140, the second load timing signals, the gate-on voltage and the gate-off voltage of the display driver 200 may be applied to the second emission driving circuit 122 through the second load timing lines LTL2. For example, the second load timing signals may include a second load matching start signal and second load matching clock signals. The second load timing lines LTL2 may include a second load matching start signal line to which the second load matching start signal is transmitted, second load matching clock lines to which the second load matching clock signals are transmitted, a gate-on voltage line, and a gate-off voltage line.

The first load timing signals transmitted to the first load matching driving circuit 130 and the first load timing lines LTL1 will be described in detail later with reference to FIG. 8.

The data lines DL (See FIG. 2) may be disposed in the display area DA. The data lines DL (See FIG. 2) may extend in the second direction (Y-axis direction) and may be arranged or disposed in the first direction (X-axis direction). The data lines DL (See FIG. 2) may intersect the scan lines GIL, GWL and GBL (see FIG. 3) as illustrated in FIG. 3.

The fan-out lines FL may be disposed between the display pads DP and the data lines DL. The fan-out lines FL may electrically connect the display pads DP and the data lines DL. Since the display pads DP may be electrically connected to the display circuit board 300, the data lines DL may be electrically connected to the display driver 200 of the display circuit board 300. Therefore, data voltages of the display driver 200 may be applied to the data lines DL.

A display pad area DPA including the display pads DP may be disposed at the lower edge of the display panel 100. The display pad area DPA may be disposed on a side opposite a side of the display panel 100 where the notch NTA may be formed. For example, in a case that the display pad area DPA may be disposed on a lower side of the display panel 100, the notch NTA may be formed on an upper side of the display panel 100.

Figure 3:
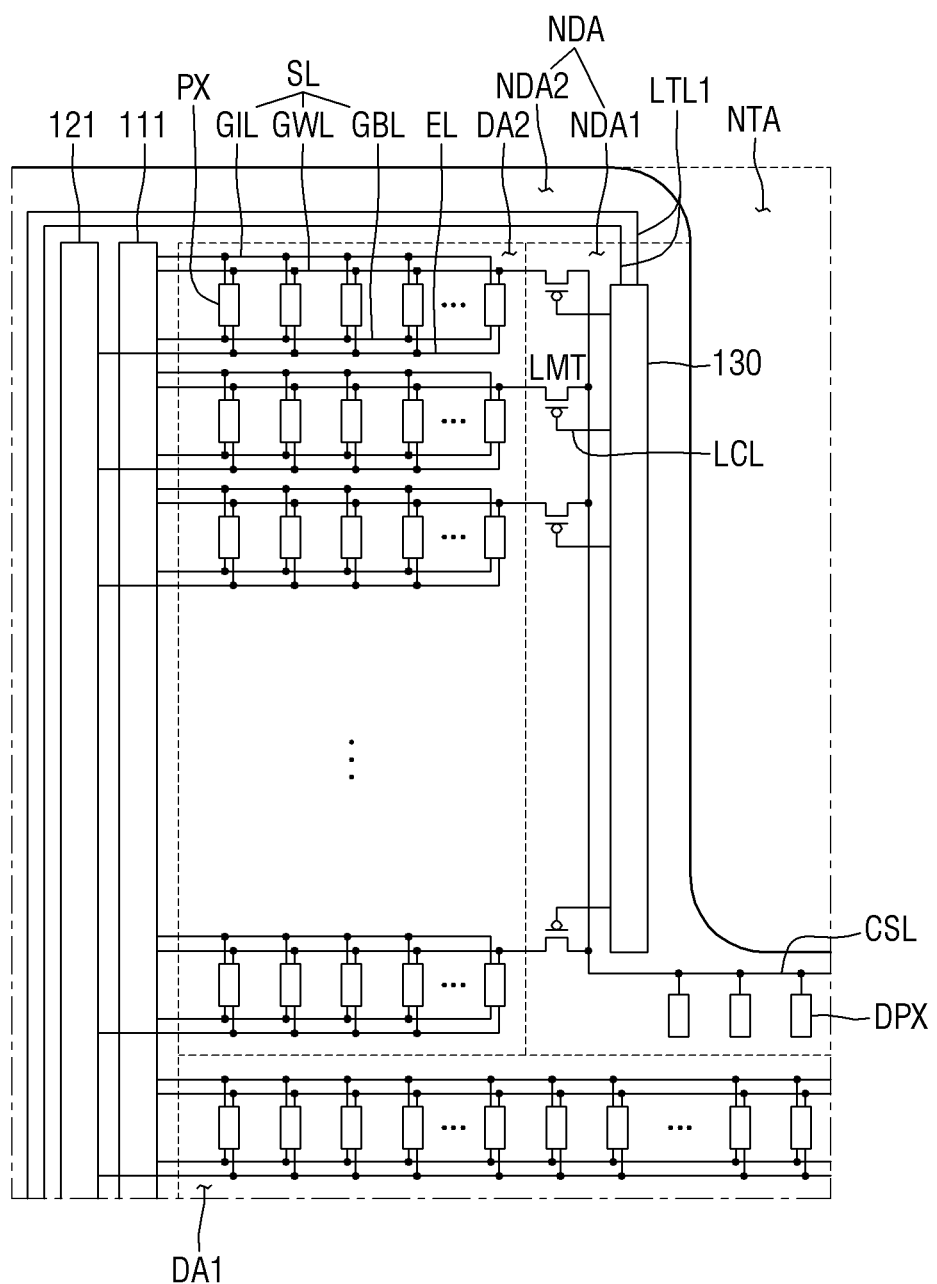
FIG. 3 is a detailed layout view illustrating an example of a first display area, a second display area, a first non-display area and a second non-display area of the display panel of FIG. 2.

FIG. 3 is a detailed layout view illustrating an example of the first display area DA1, the second display area DA2, the first non-display area NDA1 and the second non-display area NDA2 of the display panel 100 of FIG. 2.

Referring to FIG. 3, each of the first display area DA1 and the second display area DA2 may include the scan lines SL, the emission lines EL, the data lines DL, and subpixels PX.

The scan lines SL and the emission lines EL may extend in the first direction (X-axis direction). The scan lines SL may be electrically connected to the first scan driving circuit 111. The emission lines EL may be electrically connected to the first emission driving circuit 121.

The scan lines SL may include initialization scan lines GIL, write scan lines GWL, and bias scan lines GBL. Initialization scan signals may be sequentially transmitted to the initialization scan lines GIL. Write scan signals may be sequentially transmitted to the write scan lines GWL. Bias scan signals may be sequentially transmitted to the bias scan lines GBL. Emission signals may be sequentially transmitted to the emission lines EL.

The data lines DL may extend in the second direction (Y-axis direction). The data lines DL may be electrically connected to the display driver 200 of the display circuit board 300. Data voltages may be applied to the data lines DL.

Each of the subpixels PX may emit light for displaying an image. The subpixels PX may be arranged or disposed in a matrix form. The subpixels PX may be arranged or disposed side by side in the first direction (X-axis direction) and the second direction (Y-axis direction). Each of the subpixels PX may be electrically connected to an initialization scan line GIL, a write scan line GWL, a bias scan line GBL, and a data line DL. The subpixels PX will be described in detail later with reference to FIGS. 4 and 12.

The first non-display area NDA1 may include the first load matching driving circuit 130, load matching transistors LMT, the load matching control lines LCL, a common scan line CSL, and dummy pixels DPX.

The first load matching driving circuit 130 may be disposed on the right side of the second display area DA2. The first load matching driving circuit 130 may be disposed on the left side of the notch NTA. The first load matching driving circuit 130 may be electrically connected to the first load timing lines LTL1. The first load matching driving circuit 130 may generate the load matching control signals based on the first load timing signals received through the first load timing lines LTL1. The first load matching driving circuit 130 may output the load matching control signals to the load matching control lines LCL.

The load matching transistors LMT may be disposed between the second display area DA2 and the first load matching driving circuit 130. As illustrated in FIG. 3, the load matching transistors LMT may be disposed between some or a predetermined number of the scan lines SL and the common scan line CSL. For example, the load matching transistors LMT may be disposed between the write scan lines GWL among the scan lines SL and the common scan line CSL. Alternatively, the load matching transistors LMT may be disposed between the initialization scan lines GIL among the scan lines SL and the common scan line CSL. Alternatively, the load matching transistors LMT may be disposed between the bias scan lines GBL among the scan lines SL and the common scan line CSL. For ease of description, a case where the load matching transistors LMT may be disposed between the write scan lines GWL and the common scan line CSL as illustrated in FIG. 3 will be mainly described below.

The load matching transistors LMT may be tuned on/off by the load matching control signals. For example, each of the load matching transistors LMT may be turned on by a load matching control signal of a first-level voltage V1 and turned off by a load matching control signal of a second-level voltage V2. When a load matching transistor LMT electrically connected to a write scan line GWL is turned on, the write scan line GWL and the common scan line CSL may be electrically connected. When the load matching transistor LMT electrically connected to the write scan line GWL is turned off, the write scan line GWL and the common scan line CSL may be electrically disconnected. Each of the load matching transistors LMT may have a gate electrode electrically connected to a load matching control line LCL, a first electrode connected to a write scan line GWL, and a second electrode electrically connected to the common scan line CSL.

The load matching transistors LMT may be formed as thin-film transistors. Although the load matching transistors LMT have been mainly described as P-type metal oxide semiconductor field effect transistors (MOSFETs), the disclosure is not limited thereto. For example, the load matching transistors LMT may also be formed as N-type MOSFETs. Since the load matching transistors LMT serve as switch elements, they may be defined as load matching switch elements.

Since the load matching control signals are sequentially transmitted to the load matching control lines LCL, the load matching transistors LMT may be sequentially turned on. Therefore, the write scan lines GWL may be sequentially electrically connected to the common scan line CSL. For example, after a kth write scan line GWL may be electrically connected to the common scan line, a (k+1)th write scan line GWL may be electrically connected to the common scan line CSL. Then, after a (k+2)th write scan line GWL may be electrically connected to the common scan line CSL, a (k+3)th write scan line GWL may be electrically connected to the common scan line CSL.

The common scan line CSL may be electrically connected to the dummy pixels DPX and the load matching transistors LMT. The common scan line CSL may be disposed between the dummy pixels DPX and the load matching transistors LMT.

Since the dummy pixels DPX do not display an image, each of the dummy pixels DPX may not emit light. The dummy pixels DPX may be disposed on the upper side of the first display area DA1. The dummy pixels DPX may be disposed on the lower side of the notch NTA. The dummy pixels DPX may be arranged or disposed in the first direction (X-axis direction). The dummy pixels DPX may be electrically connected to the common scan line CSL. The dummy pixels DPX will be described in detail later with reference to FIGS. 5 and 13.

Alternatively, the dummy pixels DPX may be electrically connected to common scan lines. For example, the first non-display area NDA1 may include not only the load matching transistors LMT disposed between the write scan lines GWL and the common scan line CSL but also other load matching transistors disposed between the initialization scan lines GIL and another common scan line or other load matching transistors disposed between the bias scan lines GBL and another common scan line. In this case, the dummy pixels DPX may be electrically connected to another common scan line (lines).

The second non-display area NDA2 may include the first scan driving circuit 111 and the first emission driving circuit 121.

The first scan driving circuit 111 may be electrically connected to the initialization scan lines GIL, the write scan lines GWL, and the bias scan lines GBL. The first scan driving circuit 111 may be electrically connected to the first scan timing lines SCL1 (see FIG. 2). The first scan driving circuit 111 may generate the initialization scan signals, the write scan signals, and the bias scan signals based on the first scan timing signals received through the first scan timing lines SCL1 (see FIG. 2). The first scan driving circuit 111 may sequentially output the initialization scan signals to the initialization scan lines GIL. The first scan driving circuit 111 may sequentially output the write scan signals to the write scan lines GWL. The first scan driving circuit 111 may sequentially output the bias scan signals to the bias scan lines GBL.

The first emission driving circuit 121 may be electrically connected to the emission lines EL. The first emission driving circuit 121 may be electrically connected to the first emission timing lines ETL1 (see FIG. 2). The first emission driving circuit 121 may generate the emission signals based on the first emission timing signals received through the first emission timing lines ETL1 (see FIG. 2). The first emission driving circuit 121 may sequentially output the emission signals to the emission lines EL.

Since the number of subpixels PX of the second display area DA2 and the third display area DA3 may be smaller than the number of subpixels PX of the first display area DA1, a load applied to the write scan lines GWL of the second display area DA2 and the third display area DA3 may be different from a load applied to the write scan lines GWL of the first display area DA1. Therefore, pulse widths of the write scan signals of the write scan lines GWL of the second display area DA2 and the third display area DA3 may be different from pulse widths of the write scan signals of the write scan lines GWL of the first display area DA1. For example, the greater the load applied to a write scan line GWL, the smaller the pulse width of a write scan signal of the write scan line GWL due to resistive-capacitive (RC) delay. Accordingly, there may be a difference in luminance between the subpixels PX of the second display area DA2 and the third display area DA3 and the subpixels PX of the first display area DA1.

As illustrated in FIG. 3, since the first load matching driving circuit 130 sequentially outputs the load matching control signals, the load matching transistors LMT electrically connected to the write scan lines GWL of the second display area DA2 may be sequentially turned on. Therefore, the write scan lines GWL of the second display area DA2 may be sequentially electrically connected to the dummy pixels DPX electrically connected to the common scan line CSL. In this case, a load applied to the write scan lines GWL may include not only a load applied to the subpixels PX of the second display area DA2 but also a load applied to the dummy pixels DPX of the first non-display area NDA1. For example, the load applied to the write scan lines GWL of the second display area DA2 may be compensated for through the dummy pixels DPX of the first non-display area NDA1 Therefore, a difference between the load applied to the write scan lines GWL in the second display area DA2 and the load applied to the write scan lines GWL in the first display area DA1 may be minimized. Accordingly, this may reduce a difference between the pulse widths of the write scan signals of the write scan lines GWL of the second display area DA2 and the third display area DA3 and the pulse widths of the write scan signals of the write scan lines GWL of the first display area DA1, thereby preventing a difference in luminance between the subpixels PX.

Meanwhile, to reduce a load difference between the write scan lines GWL of the second display area DA2, the write scan lines GWL of the second display area DA2 may be electrically connected one-to-one to compensation capacitors.

As illustrated in FIG. 3, the dummy pixels DPX arranged or disposed in the first direction (X-axis direction) may be sequentially electrically connected to the write scan lines GWL of the second display area DA2 through the common scan line CSL by using the first load matching driving circuit 130 and the load matching transistors LMT. In this case, since the write scan lines GWL of the second display area DA2 share the dummy pixels DPX for compensating for the load, the area of the first non-display area NDA1 may be reduced than when the load difference between the write scan lines GWL of the second display area DA2 is reduced using the compensation capacitors.

The third display area DA3 of the display panel 100 may be substantially the same as the second display area DA2 described above with reference to FIG. 3 except that the left and right sides of the second display area DA2 of the display panel 100 illustrated in FIG. 3 may be reversed.

Figure 4:
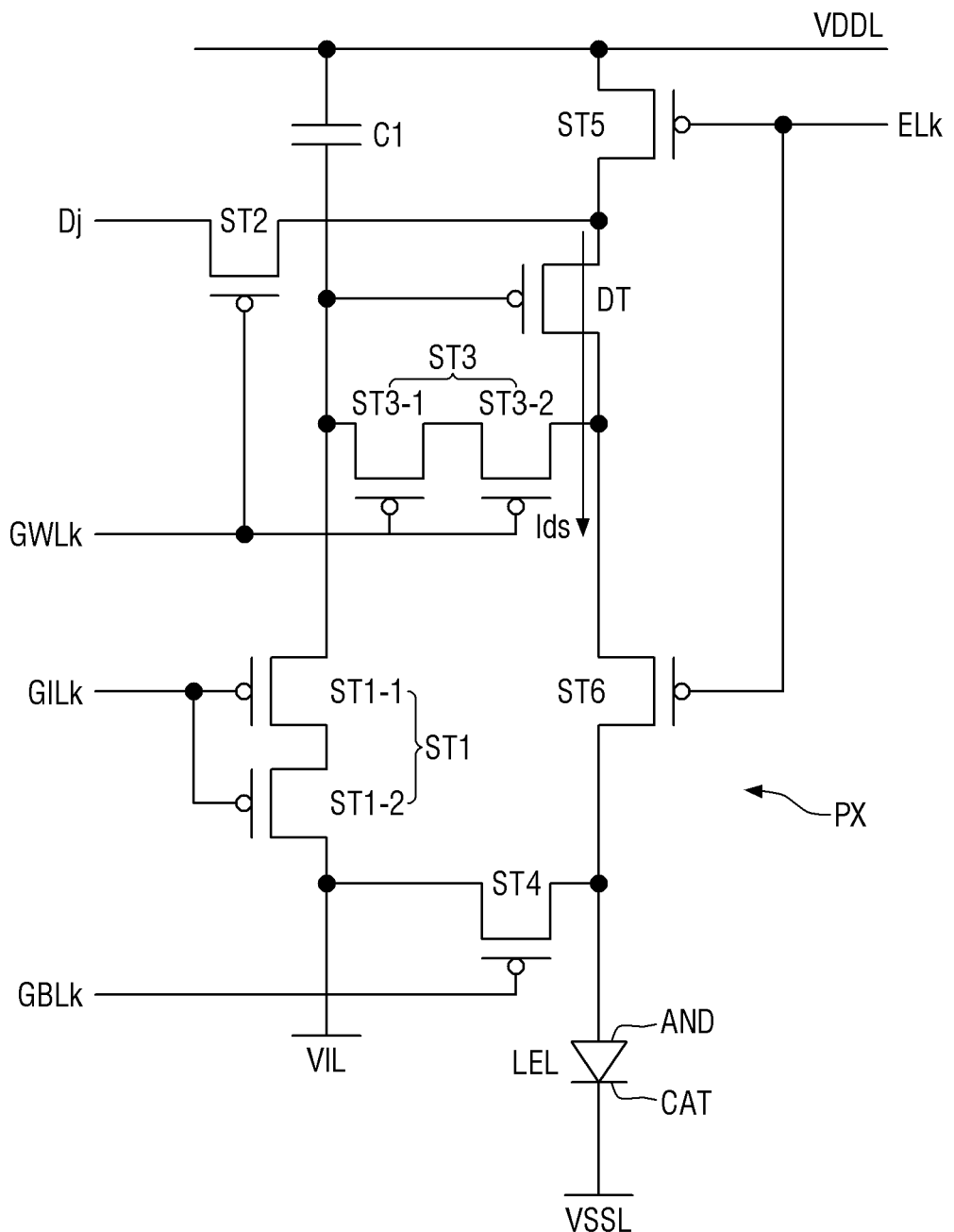
FIG. 4 is an equivalent circuit diagram of an example of a subpixel of FIG. 3.

FIG. 4 is an equivalent circuit diagram of an example of a subpixel PX of FIG. 3.

Referring to FIG. 4, the subpixel PX may be electrically connected to a kth (where k is a positive integer) initialization scan line GILk, a kth write scan line GWLk, and a kth bias scan line GBLk. The subpixel PX may be electrically connected to a first driving voltage line VDDL to which a first driving voltage is supplied, an initialization voltage line VIL to which an initialization voltage Vini is supplied, and a second driving voltage line VSSL to which a second driving voltage is supplied.

The subpixel PX may include a driving transistor DT, a light emitting element LEL, switch elements, and a capacitor C1. The switch elements include first through sixth transistors ST1 through ST6.

The driving transistor DT may include a gate electrode, a first electrode, and a second electrode. The driving transistor DT controls a drain-source current Ids (hereinafter, referred to as a "driving current") flowing between the first electrode and the second electrode according to a data voltage applied to the gate electrode. The driving current Ids flowing through a channel of the driving transistor DT is proportional to the square of a difference between a voltage Vgs between the gate electrode and a first electrode of the driving transistor DT and a threshold voltage as shown in Equation 1.

$$Ids = k' \times (Vgs - Vth)^2 \qquad (1).$$

In Equation 1, k' is a proportional coefficient determined by the structure and physical properties of a driving transistor, Vgs is a gate-source voltage of the driving transistor, and Vth is a threshold voltage of the driving transistor.

The light emitting element LEL emits light according to the driving current Ids. The amount of light emitted from the light emitting element LEL may be proportional to the driving current Ids.

The light emitting element LEL may be an organic light emitting diode including an anode AND, a cathode CAT, and an organic light emitting layer disposed between the anode AND and the cathode CAT. Alternatively, the light emitting element LEL may be an inorganic light emitting element including the anode AND, the cathode CAT, and an inorganic semiconductor disposed between the anode AND and the cathode CAT. Alternatively, the light emitting element LEL may be a quantum dot light emitting element including the anode AND, the cathode CAT, and a quantum dot light emitting layer disposed between the anode AND and the cathode CAT. Alternatively, the light emitting element LEL may be a micro light emitting diode.

The anode AND of the light emitting element LEL may be electrically connected to a first electrode of the fourth transistor ST4 and a second electrode of the sixth transistor ST6, and the cathode CAT may be electrically connected to the second driving voltage line VSSL. A parasitic capacitance may be formed between the anode AND and the cathode CAT of the light emitting element LEL.

The first transistor ST1 may be formed as a dual transistor including a (1-1)th transistor ST1-1 and a (1-2)th transistor ST1-2. The (1-1)th transistor ST1-1 and the (1-2)th transistor ST1-2 are turned on by an initialization scan signal of the kth initialization scan line GILk to electrically connect the gate electrode of the driving transistor DT and the initialization voltage line VIL. The gate electrode of the driving transistor DT may be discharged to the initialization voltage Vini of the initialization voltage line VIL. The (1-1)th transistor ST1-1 may have a gate electrode electrically connected to the kth initialization scan line GILk, a first electrode electrically connected to the gate electrode of the driving transistor DT, and a second electrode electrically connected to a first electrode of the (1-2)th transistor ST1-2. The (1-2)th transistor ST1-2 may have a gate electrode electrically connected to the kth initialization scan line GILk, the first electrode electrically connected to a second electrode of the (1-1)th transistor ST1-1, and a second electrode electrically connected to the initialization voltage line VIL.

The second transistor ST2 is turned on by a write scan signal of the kth write scan line GWLk to connect the first electrode of the driving transistor DT and a jth data line Dj. The second transistor ST2 may have a gate electrode electrically connected to the kth write scan line GWLk, a first electrode electrically connected to the first electrode of the driving transistor DT, and a second electrode electrically connected to the data line Dj.

The third transistor ST3 may be formed as a dual transistor including a (3-1)th transistor ST3-1 and a (3-2)th transistor ST3-2. The (3-1)th transistor ST3-1 and the (3-2)th transistor ST3-2 are turned on by the write scan signal of the kth write scan line GWLk to electrically connect the gate electrode and the second electrode of the driving transistor DT. For example, since the gate electrode and the second electrode of the driving transistor DT may be electrically connected when the (3-1)th transistor ST3-1 and the (3-2)th transistor ST3-2 are turned on, the driving transistor DT operates as a diode. The (3-1)th transistor ST3-1 may have a gate electrode electrically connected to the kth write scan line GWLk, a first electrode electrically connected to a second electrode of the (3-2)th transistor ST3-2, and a second electrode electrically connected to the gate electrode of the driving transistor DT. The (3-2)th transistor ST3-2 may have a gate electrode electrically connected to the kth write scan line GWLk, a first electrode connected to the second electrode of the driving transistor DT, and the second electrode electrically connected to the first electrode of the (3-1)th transistor ST3-1.

The fourth transistor ST4 is turned on by a bias scan signal of the kth bias scan line GBLk to electrically connect the anode AND of the light emitting element LEL and the initialization voltage line VIL. The anode AND of the light emitting element LEL may be discharged to the initialization voltage Vini. The fourth transistor ST4 may have a gate electrode electrically connected to the kth bias scan line GBLk, the first electrode electrically connected to the anode AND of the light emitting element LEL, and a second electrode electrically connected to the initialization voltage line VIL.

The fifth transistor ST5 is turned on by an emission control signal of a kth emission line ELk to electrically connect the first electrode of the driving transistor DT and the first driving voltage line VDDL. The fifth transistor ST5 has a gate electrode electrically connected to the kth emission line ELk, a first electrode electrically connected to the first driving voltage line VDDL, and a second electrode electrically connected to the first electrode of the driving transistor DT.

The sixth transistor ST6 may be electrically connected between the second electrode of the driving transistor DT and the anode AND of the light emitting element LEL. The sixth transistor ST6 is turned on by the emission control signal of the kth emission line ELk to electrically connect the second electrode of the driving transistor DT and the anode AND of the light emitting element LEL. The sixth transistor ST6 has a gate electrode electrically connected to the kth emission line ELk, a first electrode electrically connected to the second electrode of the driving transistor DT, and the second electrode electrically connected to the anode AND of the light emitting element LEL. When both the fifth transistor ST5 and the sixth transistor ST6 are turned on, the driving current Ids may be supplied to the light emitting element LEL.

The capacitor C1 may be formed or disposed between the second electrode of the driving transistor DT and the first driving voltage line VDDL. An electrode of the capacitor C1 may be electrically connected to the second electrode of the driving transistor DT, and the other electrode may be electrically connected to the first driving voltage line VDDL.

In a case that the first electrode of each of the first through sixth transistors ST1 through ST6 and the driving transistor DT is a source electrode, the second electrode may be a drain electrode. Alternatively, in a case that the first electrode of each of the first through sixth transistors ST1 through ST6 and the driving transistor DT is a drain electrode, the second electrode may be a source electrode.

An active layer of each of the first through sixth transistors ST1 through ST6 and the driving transistor DT may be made of any one of polysilicon, amorphous silicon, and an oxide semiconductor. Although the first through sixth transistors ST1 through ST6 and the driving transistor DT are formed as P-type MOSFETs in FIG. 4, the disclosure is not limited thereto. For example, the first through sixth transistors ST1 through ST6 and the driving transistor DT may also be formed as N-type MOSFETs.

The first driving voltage of the first driving voltage line VDDL, the second driving voltage of the second driving voltage line VSSL, and the initialization voltage Vini of the initialization voltage line VIL may be set in consideration of characteristics of the driving transistor DT and characteristics of the light emitting element LEL. For example, a difference between the initialization voltage Vini and the data voltage supplied to the first electrode of the driving transistor DT may be set to be smaller than the threshold voltage of the driving transistor DT.

Figure 5:
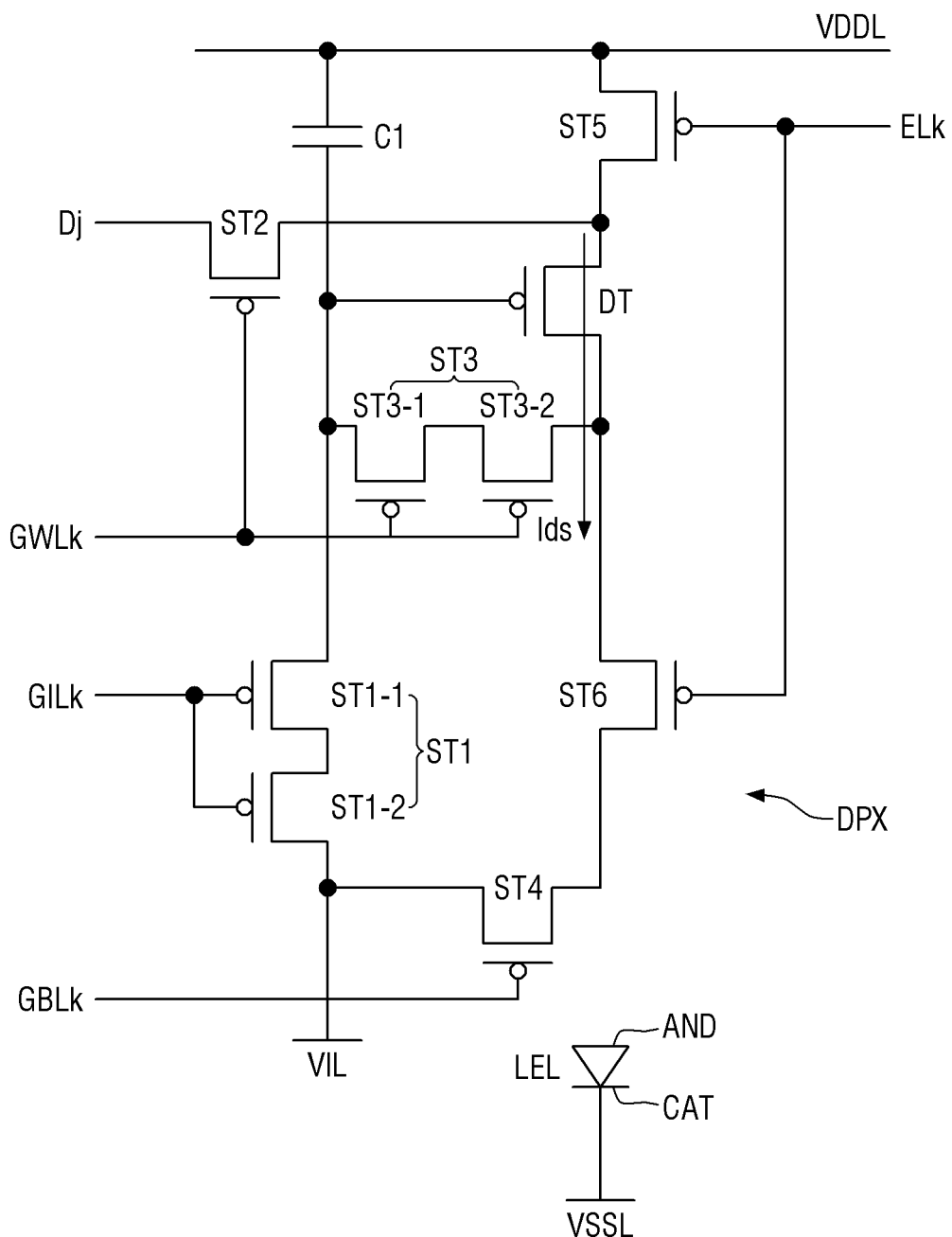
FIG. 5 is an equivalent circuit diagram of an example of a dummy pixel of FIG. 3.

FIG. 5 is an equivalent circuit diagram of an example of a dummy pixel DPX of FIG. 3.

An embodiment of FIG. 5 may be different from an embodiment of FIG. 4 in that a second electrode of a sixth transistor ST6 and an anode AND of a light emitting element LEL may be physically or electrically disconnected.

Referring to FIG. 5, since a driving current Ids does not flow through the light emitting element LEL of the dummy pixel DPX, the light emitting element LEL does not emit light. For example, a driving transistor DT and first through sixth transistors ST1 through ST6 of the dummy pixel DPX may operate in the same way as the driving transistor DT and the first through sixth transistors ST1 through ST6 of the subpixel PX. However, since the second electrode of the sixth transistor ST6 and the anode AND of the light emitting element LEL are physically or electrically disconnected, the driving current Ids does not flow through the light emitting element LEL.

As illustrated in FIG. 5, the dummy pixel DPX has a load similar to that of the subpixel PX without emitting light to display an image. Therefore, the dummy pixel DPX may be used as a pixel for compensating for a load applied to the write scan lines GWL of the second display area DA2.

Figure 6:
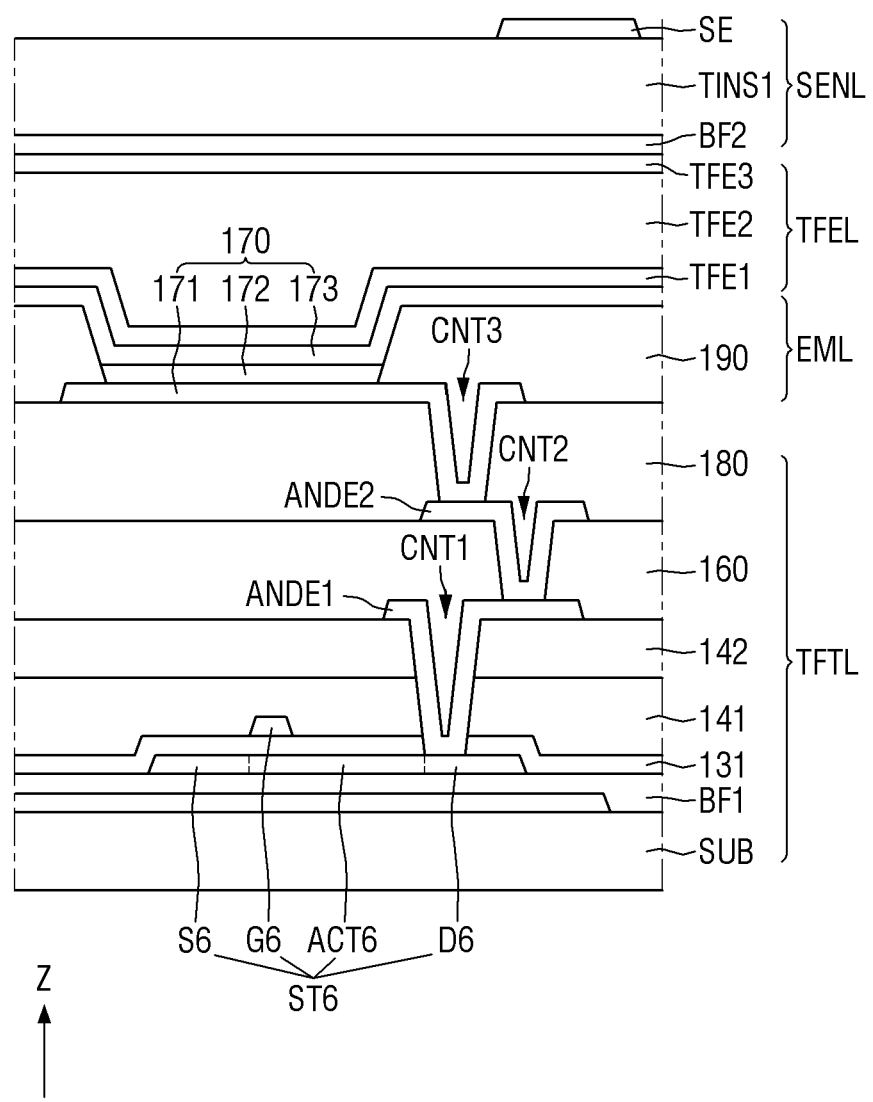
FIG. 6 is a schematic cross-sectional view of an example of a sixth transistor and a light emitting element of the subpixel of FIG. 4.

FIG. 6 is a schematic cross-sectional view of an example of the sixth transistor ST6 and the light emitting element LEL of the subpixel PX of FIG. 4. In FIG. 6, only the sixth transistor ST6 among the driving transistor DT and the first through sixth transistors ST1 through ST6 of the subpixel PX are illustrated for ease of description.

Referring to FIG. 6, a first buffer layer BF1 may be disposed on a substrate SUB, and a thin-film transistor layer TFTL, a light emitting element layer EML, an encapsulation layer TFEL and a touch electrode layer SENL may be sequentially disposed on the first buffer layer BF1.

The substrate SUB may be made of an insulating material such as glass, quartz, or polymer resin. For example, the substrate SUB may include polyimide. The substrate SUB may be a flexible substrate that may be bent, folded, and rolled.

The first buffer layer BF1 is a layer for protecting thin-film transistors of the thin-film transistor layer TFTL and a light emitting layer 172 of the light emitting element layer EML from moisture introduced through the substrate SUB which is vulnerable to moisture penetration. The first buffer layer BF1 may be composed of inorganic layers alternately stacked. For example, the first buffer layer BF1 may be a multilayer in which one or more inorganic layers selected from a silicon nitride layer, a silicon oxynitride layer, a silicon oxide layer, a titanium oxide layer, and an aluminum oxide layer are alternately stacked.

A light blocking layer BML may be disposed on the substrate SUB. The light blocking layer BML may overlap active layers of the thin-film transistors to prevent generation of leakage current due to light incident on the active layers of the thin-film transistors. For example, the light blocking layer BML may overlap an active layer ACT6 of the sixth transistor ST6 in a third direction (Z-axis direction) which is a thickness direction of the display panel 100. The light blocking layer BML may be covered or overlapped by the first buffer layer BF1. The light blocking layer BML may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The thin-film transistor layer TFTL may include the transistors, a gate insulating layer 131, a first interlayer insulating film 141, a second interlayer insulating film 142, a first planarization layer 160, and a second planarization layer 180. Each of the transistors may include an active layer, a gate electrode, a first electrode, and a second electrode. For example, the sixth transistor ST6 may include the active layer ACT6, a gate electrode G6, a first electrode S6, and a second electrode D6.

The active layer ACT6, the first electrode S6, and the second electrode D6 may be formed or disposed on the first buffer layer BF1. The active layer ACT6 may include polycrystalline silicon, monocrystalline silicon, low-temperature polycrystalline silicon, amorphous silicon, or an oxide semiconductor. In a case that the active layer ACT6 is made of polycrystalline silicon, the ion-doped active layer ACT6 may have conductivity. Therefore, the first electrode S6 and the second electrode D6 may be formed by doping the active layer ACT6 with ions.

The gate insulating layer 131 may be formed or disposed on the active layer ACT6, the first electrode S6, and the second electrode D6. The gate insulating layer 131 may be an inorganic layer, for example, a silicon nitride layer, a silicon oxynitride layer, a silicon oxide layer, a titanium oxide layer, or an aluminum oxide layer.

The gate electrode G6 may be formed or disposed on the gate insulating layer 131. The gate electrode G6 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The first interlayer insulating film 141 may be formed or disposed on the gate electrode G6. The first interlayer insulating film 141 may be an inorganic layer, for example, a silicon nitride layer, a silicon oxynitride layer, a silicon oxide layer, a titanium oxide layer, or an aluminum oxide layer. The first interlayer insulating film 141 may include inorganic layers.

A capacitor electrode may be disposed on the first interlayer insulating film 141. The capacitor electrode may overlap the gate electrode of the driving transistor DT in the third direction (Z-axis direction).

The second interlayer insulating film 142 may be formed or disposed on the first interlayer insulating film 141. The second interlayer insulating film 142 may be an inorganic layer, for example, a silicon nitride layer, a silicon oxynitride layer, a silicon oxide layer, a titanium oxide layer, or an aluminum oxide layer. The second interlayer insulating film 142 may include inorganic layers.

A first anode connection electrode ANDE1 may be included on the second interlayer insulating film 142. The first anode connection electrode ANDE1 may be electrically connected to the first electrode S6 of the sixth transistor ST6 through a first contact hole CNT1 penetrating the gate insulating layer 131, the first interlayer insulating film 141, and the second interlayer insulating film 142. The first anode connection electrode ANDE1 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The first planarization layer 160 may be formed or disposed on the first anode connection electrode ANDE1 to flatten a step due to the active layer ACT6, the first electrode S6, the second electrode D6, the gate electrode G6, and the first anode connection electrode ANDE1. The first planarization layer 160 may be an organic layer such as acryl resin, epoxy resin, phenolic resin, polyamide resin, or polyimide resin.

A protective layer may be formed or disposed between the first anode connection electrode ANDE1 and the first planarization layer 160. The protective layer may be an inorganic layer, for example, a silicon nitride layer, a silicon oxynitride layer, a silicon oxide layer, a titanium oxide layer, or an aluminum oxide layer.

A second anode connection electrode ANDE2 may be formed or disposed on the first planarization layer 160. The second anode connection electrode ANDE2 may be electrically connected to the first anode connection electrode ANDE1 through a contact hole CNT2 penetrating the first planarization layer 160. The second anode connection electrode ANDE2 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

The second planarization layer 180 may be formed or disposed on the second anode connection electrode ANDE2. The second planarization layer 180 may be an organic layer such as acryl resin, epoxy resin, phenolic resin, polyamide resin, or polyimide resin.

In FIG. 6, the sixth transistor ST6 may be formed as a top-gate type in which the gate electrode G6 may be located or disposed above the active layer ACT6. However, it should be noted that the disclosure is not limited thereto. For example, each transistor of the thin-film transistor layer TFTL may also be formed as a bottom-gate type or a double-gate type other than the top-gate type. In the bottom-gate type, the gate electrode G6 may be located or disposed under or below the active layer ACT6. In the double-gate type, the gate electrode G6 may be located or disposed both above and under or below the active layer ACT6.

The light emitting element layer EML may be formed or disposed on the thin-film transistor layer TFTL. The light emitting element layer EML may include light emitting elements 170 and a bank 190.

The light emitting elements 170 and the bank 190 are formed or disposed on the planarization layer 160. Each of the light emitting elements 170 may include a first light emitting electrode 171, the light emitting layer 172, and a second light emitting electrode 173. The first light emitting electrode 171 may be an anode, and the second light emitting electrode 173 may be a cathode.

The first light emitting electrode 171 may be formed or disposed on the second planarization layer 180. The first light emitting electrode 171 may be electrically connected to the second anode connection electrode ANDE2 through a contact hole CNT3 penetrating the second planarization layer 180.

In a top emission structure in which light is emitted in a direction from the light emitting layer 172 toward the second light emitting electrode 173, the first light emitting electrode 171 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The bank 190 may be formed or disposed on the second planarization layer 180 to define the first light emitting electrode 171 so as to define an emission area EMA. The bank 190 may be formed or disposed to cover or overlap edges of the first light emitting electrode 171. The bank 190 may be an organic layer such as acryl resin, epoxy resin, phenolic resin, polyamide resin, or polyimide resin.

The emission area EMA may be an area in which the first light emitting electrode 171, the light emitting layer 172 and the second light emitting electrode 173 may be sequentially stacked so that holes from the first light emitting electrode 171 and electrons from the second light emitting electrode 173 combine together in the light emitting layer 172 to emit light.

The light emitting layer 172 may be formed or disposed on the first light emitting electrode 171 and the bank 190. The light emitting layer 172 may include an organic material to emit light of a predetermined color. For example, the light emitting layer 172 may include a hole transporting layer, an organic material layer, and an electron transporting layer.

The second light emitting electrode 173 is formed or disposed on the light emitting layer 172. The second light emitting electrode 173 may be formed or disposed to cover or overlap the light emitting layer 172. The second light emitting electrode 173 may be a common layer common to all subpixels PX. A capping layer may be formed or disposed on the second light emitting electrode 173.

In the top emission structure, the second light emitting electrode 173 may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. In a case that the second light emitting electrode 173 is made of a semi-transmissive conductive material, light output efficiency may be increased by a microcavity.

The encapsulation layer TFEL may be formed or disposed on the light emitting element layer EML. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign substances such as dust. For example, the encapsulation layer TFEL may include a first inorganic layer TFE1, an organic layer TFE2, and a second inorganic layer TFE3.

The first inorganic layer TFE1 may be disposed on the second light emitting electrode 173, the organic layer TFE2 may be disposed on the first inorganic layer TFE1, and the second inorganic layer TFE3 may be disposed on the organic layer TFE2. Each of the first inorganic layer TFE1 and the second inorganic layer TFE3 may be a multilayer in which one or more inorganic layers selected from a silicon nitride layer, a silicon oxynitride layer, a silicon oxide layer, a titanium oxide layer, and an aluminum oxide layer are alternately stacked. The organic layer TFE2 may be a monomer.

The touch electrode layer SENL is disposed on the encapsulation layer TFEL. The touch electrode layer SENL may include a second buffer layer BF2, touch electrodes SE, and a first touch insulating layer TINS1.

The second buffer layer BF2 may be disposed on the encapsulation layer TFEL. The second buffer layer BF2 may include at least one inorganic layer. For example, the second buffer layer BF2 may be a multilayer in which one or more inorganic layers selected from a silicon nitride layer, a silicon oxynitride layer, a silicon oxide layer, a titanium oxide layer, and an aluminum oxide layer are alternately stacked. The second buffer layer BF2 may be omitted.

The first touch insulating layer TINS1 may be disposed on the second buffer layer BF2. The first touch insulating layer TINS1 may be an inorganic layer, for example, a silicon nitride layer, a silicon oxynitride layer, a silicon oxide layer, a titanium oxide layer, or an aluminum oxide layer. Alternatively, the first touch insulating layer TINS1 may be an organic layer, for example, acryl resin, epoxy resin, phenolic resin, polyamide resin, or polyimide resin.

The touch electrodes SE may be disposed on the first touch insulating layer TINS1. The touch electrodes SE do not overlap the emission area EMA. For example, the touch electrodes SE are not disposed in the emission area EMA. Each of the touch electrodes SE may be a single layer made of molybdenum (Mo), titanium (Ti), copper (Cu) or aluminum (Al) or may have a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

Figure 7:
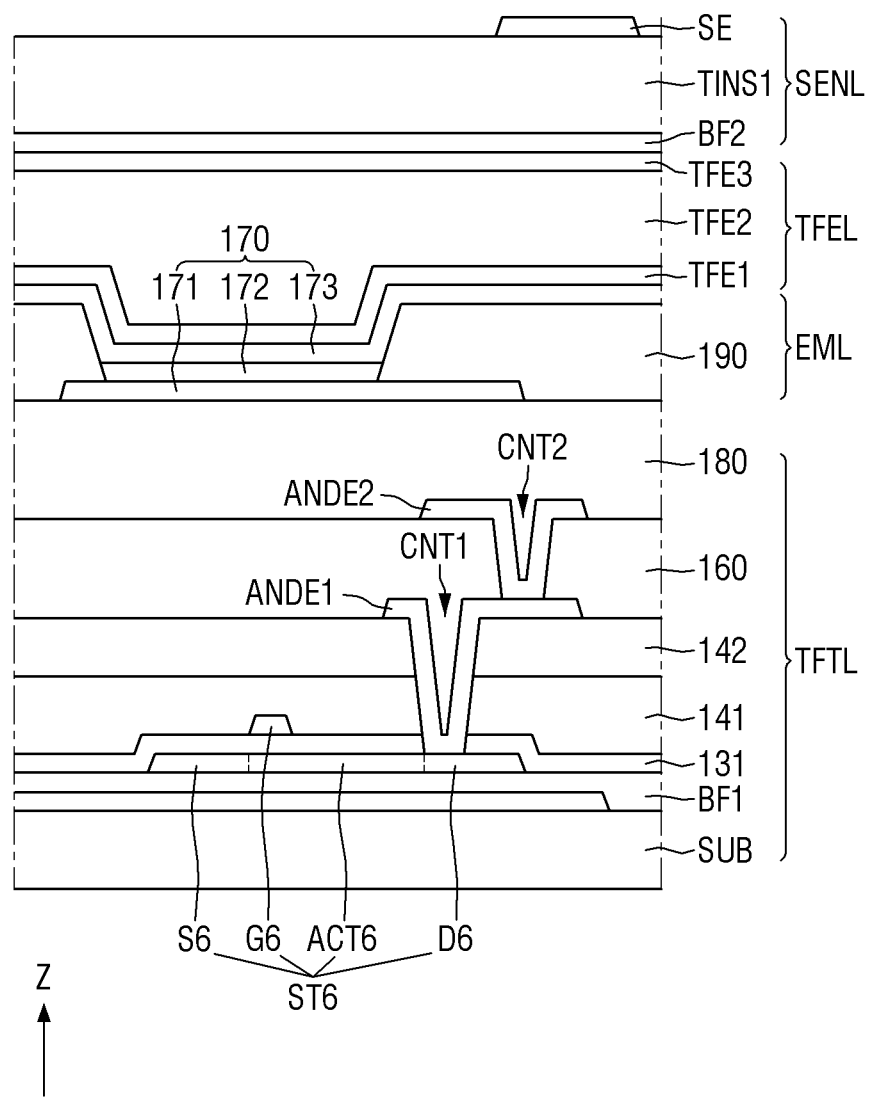
FIG. 7 is a schematic cross-sectional view of an example of a sixth transistor and a light emitting element of the dummy pixel of FIG. 5.

FIG. 7 is a schematic cross-sectional view of an example of the sixth transistor ST6 and the light emitting element LEL of the dummy pixel DPX of FIG. 5.

An embodiment of FIG. 7 may be different from an embodiment of FIG. 6 in that a first light emitting electrode 171 of the light emitting element LEL of the dummy pixel DPX may not be electrically connected to a second anode connection electrode ANDE2.

Referring to FIG. 7, a third contact hole CNT3 penetrating a second planarization layer 180 may not be formed in the dummy pixel DPX. Therefore, the first light emitting electrode 171 of the light emitting element LEL of the dummy pixel DPX may not be electrically connected to the second anode connection electrode ANDE2. Thus, since the first light emitting electrode 171 of the light emitting element LEL may not be electrically connected to a second electrode D6 of the sixth transistor ST6, no voltage may be applied to the first light emitting electrode 171 of the light emitting electrode LEL. For example, the first light emitting electrode 171 of the light emitting element LEL may be floating.

As illustrated in FIG. 7, since the first light emitting electrode 171 of the light emitting element LEL may not be electrically connected to the second electrode D6 of the sixth transistor ST6, the dummy pixel DPX may not emit light to display an image.

Figure 8:
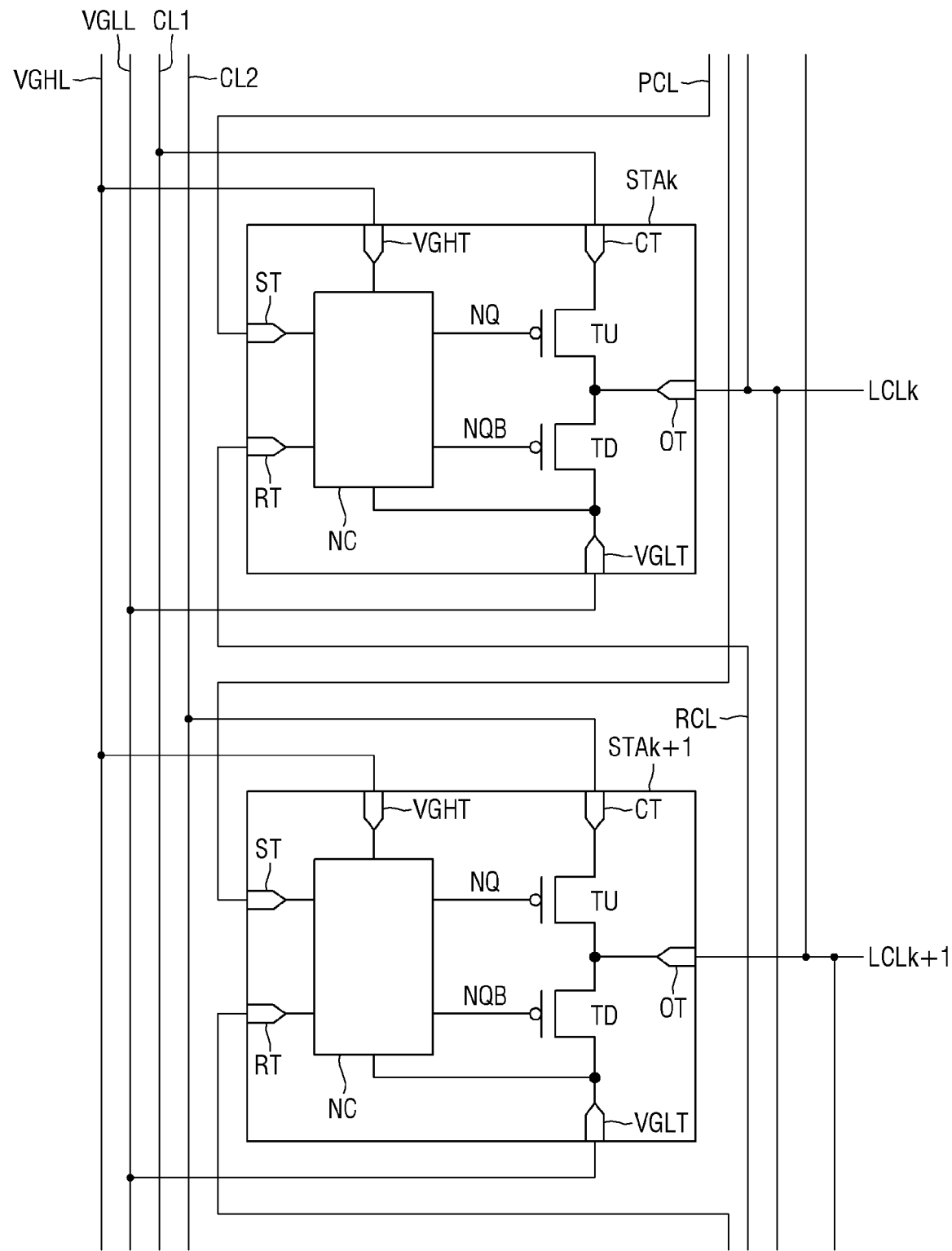
FIG. 8 illustrates an example of stages of a first load matching driving circuit of FIG. 3.

FIG. 8 illustrates an example of stages of the first load matching driving circuit 130 of FIG. 3.

In FIG. 8, a kth stage STAk and a (k+1)th stage STAk+1 of the first load matching driving circuit 130 are illustrated for ease of description.

Referring to FIG. 8, the first load matching driving circuit 130 may include stages STAk and STAk+1 dependently electrically connected to each other. The number of stages STAk and STAk+1 of the first load matching driving circuit 130 may be equal to the number of load matching transistors LMT.

The stages STAk and STAk+1 may sequentially output load matching control signals. For example, the kth stage STAk may be electrically connected to a kth load matching control line LCLk to output a kth load matching control signal. The (k+1)th stage STAk+1 may be electrically connected to a (k+1)th load matching control line LCLk+1 to output a (k+1)th load matching control signal.

Each of the stages STAk and STAk+1 may include, as illustrated in FIG. 8, a pull-up node NQ, a pull-down node NQB, a pull-up transistor TU that may be turned on when the pull-up node NQ has a gate-on voltage, a pull-down transistor TD that may be turned on when the pull-down node NQB has the gate-on voltage, and a node controller NC for controlling charging and discharging of the pull-up node NQ and the pull-down node NQB.

The node controller NC may include a start terminal ST, a reset terminal RT, a gate-on voltage terminal VGHT, a gate-off voltage terminal VGLT, a clock terminal CT, and an output terminal OT. The start terminal ST may be electrically connected to a front carry line PCL to which a load matching start signal or an output signal of a previous stage is transmitted. The reset terminal RT may be electrically connected to a rear carry line RCL to which an output signal of a next stage is input. The gate-on voltage terminal VGHT may be electrically connected to a gate-on voltage line VGHL to which the gate-on voltage is applied. The gate-off voltage terminal VGLT may be electrically connected to a gate-off voltage line VGLL to which a gate-off voltage is applied. The gate-on voltage may be the first-level voltage V1, and the gate-off voltage may be the second-level voltage V2. The node controller NC may include thin-film transistors.

The first load timing lines LTL1 (see FIG. 3) electrically connected to the first load matching driving circuit 130 may include a load matching start signal line to which the load matching start signal may be transmitted, load matching clock lines CL1 and CL2 to which load matching clock signals may be transmitted, the gate-on voltage line VGHL, and the gate-off voltage line VGLL.

The clock terminal CT may be electrically connected to any one of a first load matching clock line CL1 to which a first load matching clock signal is transmitted and a second load matching clock line CL2 to which a second load matching clock signal is transmitted. The stages STAk and STAk+1 may be alternately electrically connected to the first load matching clock line CL1 and the second load matching clock line CL2. For example, when the clock terminal CT of the kth stage STAk may be electrically connected to the first load matching clock line CL1, the clock terminal CT of the (k+1)th stage STAk+1 may be electrically connected to the second load matching clock line CL2. Although the stages STAk and STAk+1 are alternately electrically connected to two load matching clock lines CL1 and CL2 in FIG. 8, the disclosure is not limited thereto. For example, the stages STAk and STAk+1 may be alternately electrically connected to three or more load matching clock lines.

The output terminal OT may be electrically connected to any one of the load matching control lines LCLk and LCLk+1. The stages STAk and STAk+1 may be sequentially electrically connected to the load matching control lines LCLk and LCLk+1. For example, the output terminal OT of the kth stage STAk may be electrically connected to the kth load matching control line LCLk, and the output terminal OT of the (k+1)th stage STAk+1 may be electrically connected to the (k+1)th load matching control line LCLk+1.

The node controller NC controls charging and discharging of the pull-up node NQ and the pull-down node NQB according to the load matching start signal or the output signal of the previous stage input to the start terminal ST. To stably control an output of the stage, the node controller NC controls the pull-down node NQB to have the gate-off voltage when the pull-up node NQ has the gate-on voltage and controls the pull-up node NQ to have the gate-off voltage when the pull-down node NQB has the gate-on voltage. To this end, the node controller NC may include thin-film transistors.

The pull-up transistor TU is turned on when the pull-up node NQ has the gate-on voltage and outputs any one of the load matching clock signals input to the clock terminal CT to the output terminal OT. The pull-down transistor TD is turned on when the pull-down node NQB has the gate-on voltage and outputs the gate-off voltage of the gate-off voltage terminal VGLT to the output terminal OT.

The pull-up transistor TU and the pull-down transistor TD of each of the stages STAk and STAk+1 and the transistors of the node controller NC may be formed as thin-film transistors. Although the pull-up transistor TU and the pull-down transistor TD of each of the stages STAk and STAk+1 and the transistors of the node controller NC are formed as P-type MOSFETs in FIG. 8, embodiments of the specification are not limited thereto. For example, the pull-up transistor TU and the pull-down transistor TD of each of the stages STAk and STAk+1 and the transistors of the node controller NC may also be formed as N-type MOSFETs.

Stages of the second load matching driving circuit 140 illustrated in FIG. 2 may be substantially the same as the stages STAk and STAk+1 of the first load matching driving circuit 130 described above with reference to FIG. 8.

Stages of the first scan driving circuit 111 and the second scan driving circuit 112 illustrated in FIGS. 2 and 3 may be substantially the same as the stages STAk and STAk+1 of the first load matching driving circuit 130 described above with reference to FIG. 8. For example, each of the stages of the first scan driving circuit 111 and the second scan driving circuit 112 illustrated in FIGS. 2 and 3 may include a pull-up node NQ, a pull-down node NQB, a pull-up transistor TU, and a node controller NC as illustrated in FIG. 8. However, the detailed circuit configuration of the node controller NC of each of the stages of the first scan driving circuit 111 and the second scan driving circuit 112 may be different from that of the node controller NC of each of the stages STAk and STAk+1 of the first load matching driving circuit 130. For example, the number and connection relationship of thin-film transistors of the node controller NC of each of the stages of the first scan driving circuit 111 and the second scan driving circuit 112 may be different from the number and connection relationship of the thin-film transistors of the node controller NC of each of the stages STAk and STAk+1 of the first load matching driving circuit 130.

Stages of the first emission driving circuit 121 and the second emission driving circuit 122 illustrated in FIGS. 2 and 3 may be substantially the same as the stages STAk and STAk+1 of the first load matching driving circuit 130 described above with reference to FIG. 8. For example, each of the stages of the first emission driving circuit 121 and the second emission driving circuit 122 illustrated in FIGS. 2 and 3 may include a pull-up node NQ, a pull-down node NQB, a pull-up transistor TU, and a node controller NC as illustrated in FIG. 8. However, the detailed circuit configuration of the node controller NC of each of the stages of the first emission driving circuit 121 and the second emission driving circuit 122 may be different from that of the node controller NC of each of the stages STAk and STAk+1 of the first load matching driving circuit 130. For example, the number and connection relationship of thin-film transistors of the node controller NC of each of the stages of the first emission driving circuit 121 and the second emission driving circuit 122 may be different from the number and connection relationship of the thin-film transistors of the node controller NC of each of the stages STAk and STAk+1 of the first load matching driving circuit 130.

Figure 9:
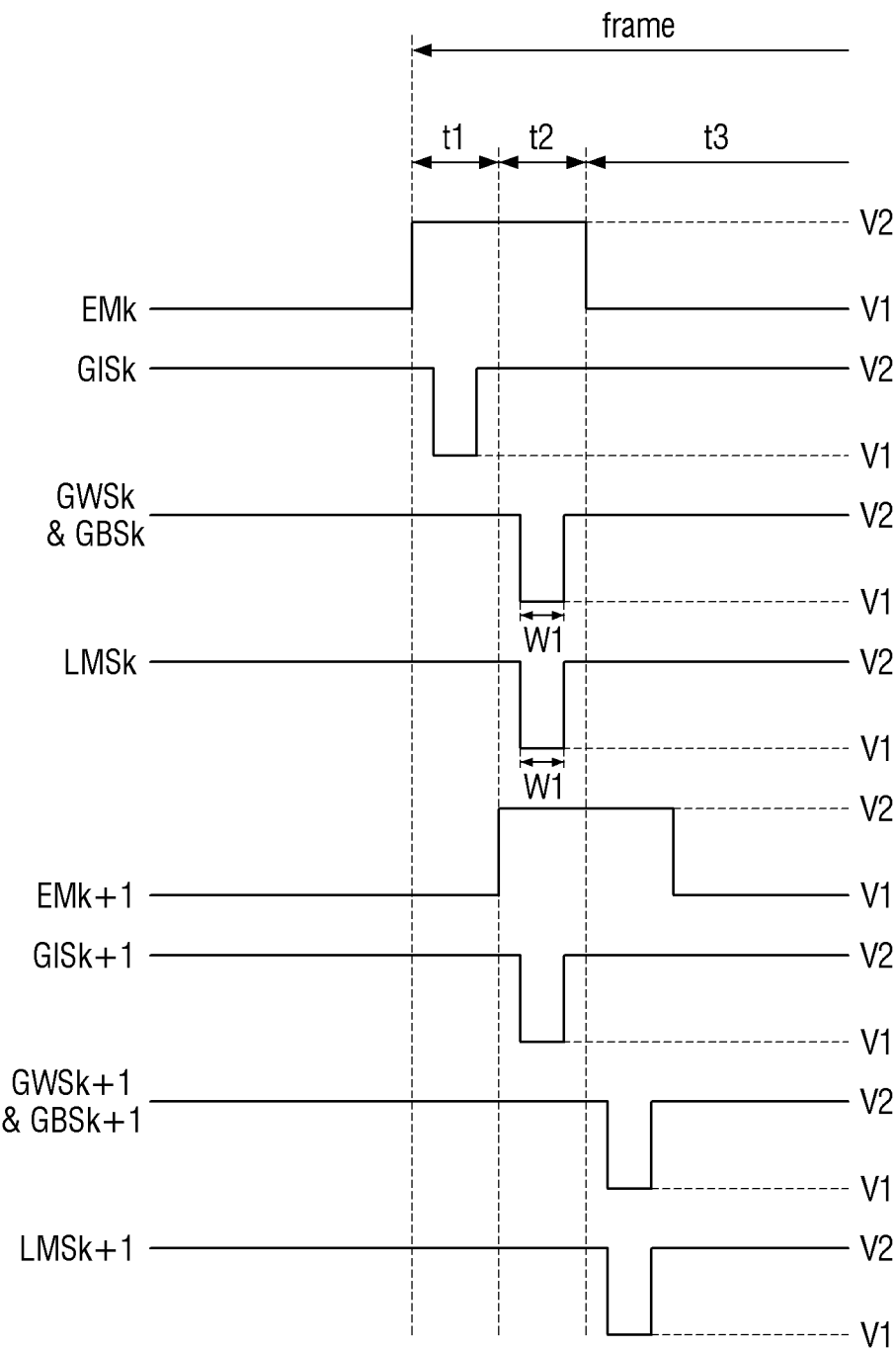
FIG. 9 is a waveform diagram illustrating initialization scan signals, write scan signals, bias scan signals, emission signals, and load matching control signals according to an embodiment.

FIG. 9 is a waveform diagram illustrating initialization scan signals, write scan signals, bias scan signals, emission signals, and load matching control signals according to an embodiment.

FIG. 9 illustrates a kth initialization scan signal GISk transmitted to the kth initialization scan line GILk, a (k+1)th initialization scan signal GISk+1 transmitted to a (k+1)th initialization scan line, a kth write scan signal GWSk transmitted to the kth write scan line GWLk, a (k+1)th write scan signal GWSk+1 transmitted to a (k+1)th write scan line, a kth bias scan signal GBSk transmitted to the kth bias scan line GBLk, a (k+1)th bias scan signal GBSk+1 transmitted to a (k+1)th bias scan line, a kth emission signal EMk transmitted to the kth emission line ELk, a (k+1)th emission signal EMk+1 transmitted to a (k+1)th emission line, a kth load matching control signal LMSk transmitted to the kth load matching control line LCLk, and a (k+1)th load matching control signal LMSk+1 transmitted to the (k+1)th load matching control line LCLk+1.

The initialization scan signals GISk and GISk+1 are signals for controlling on/off of the first transistor ST1. The write scan signals GWSk and GWSk+1 are signals for controlling on/off of each of the second transistor ST2 and the third transistor ST3. The bias scan signals GBSk and GBSk+1 are signals for controlling on/off of the fourth transistor ST4. The emission signals EMk and EMk+1 are signals for controlling on/off of the fifth transistor ST5 and the sixth transistor ST6. The kth load matching control signal LMSk and the (k+1)th load matching control signal LMSk+1 are signals for controlling the load matching transistors LMT. The initialization scan signals GISk and GISk+1, the write scan signals GWSk and GWSk+1, the bias scan signals GBSk and GBSk+1, the emission signals EMk and EMk+1, and the load matching control signals LMSk and LMSk+1 may be generated at intervals of one frame period.

One frame period may include a first period t1, a second period t2, and a third period t3. The first period t1 is a period of time during which an on-bias is applied to the driving transistor DT by applying the initialization voltage Vini to the gate electrode of the driving transistor DT, the second period t2 is a period of time during which a data voltage is supplied to the gate electrode of the driving transistor DT and a threshold voltage of the driving transistor DT is sampled, and the third period t3 is a period of time during which the light emitting element LEL emits light according to the voltage of the gate electrode of the driving transistor DT.

The kth initialization scan signal GISk may be output as the first-level voltage V1 during the first period t1 and may be output as the second-level voltage V2 during the second period t2 and the third period t3. The kth write scan signal GWSk, the kth bias scan signal GBSk, and the kth load matching control signal LMSk may have the first-level voltage V1 during the second period t2 and may have the second-level voltage V2 during the first period t1 and the third period t3. The kth emission signal EMk may have the first-level voltage V1 during the third period t3 and have the second-level voltage V2 during the first period t1 and the second period t2.

A pulse of the kth write scan signal GWSk, a pulse of the kth bias scan signal GBSk, and a pulse of the kth load matching control signal LMSk may be generated during the same period. A pulse width of the kth write scan signal GWSk, a pulse width of the kth bias scan signal GBSk, and a pulse width of the kth load matching control signal LMSk may be substantially equal. For example, as illustrated in FIG. 9, the pulse width of the kth write scan signal GWSk, the pulse width of the kth bias scan signal GBSk, and the pulse width of the kth load matching control signal LMSk may all be a first pulse width W1. The first pulse width W1 may be shorter than the second period t2. The pulse of the kth write scan signal GWSk may be defined as the kth write scan signal GWSk generated as the first-level voltage V1. The pulse of the kth bias scan signal GBSk may be defined as the kth bias scan signal GBSk generated as the first-level voltage V1. The pulse of the kth load matching control signal LMSk may be defined as the kth load matching control signal LMSk generated as the first-level voltage V1.

Each of the first period t1 and the second period t2 may be one horizontal period. Since one horizontal period indicates a period of time during which a data voltage is supplied to each subpixel PX disposed in one horizontal line, it may be defined as one horizontal line scan period. The subpixels PX disposed in one horizontal line may be defined as subpixels electrically connected to one initialization scan line, one write scan line, one bias scan line, and one emission line. Data voltages may be supplied to the data lines DL in synchronization with the first-level voltage V1 of each scan signal.

The first-level voltage V1 corresponds to a scan-on voltage that can turn on each of the first through sixth transistors ST1 through ST6. The second-level voltage V2 corresponds to a scan-off voltage that can turn off each of the first through sixth transistors ST1 through ST6. The first-level voltage V1 may be about −8 V, and the second-level voltage V2 may be 7 V.

The operation of the subpixel PX during the first period t1, the second period t2, and the third period t3 will now be described in detail with reference to FIGS. 4 and 9.

First, in the first period t1, the kth initialization scan signal GISk having the first-level voltage V1 is supplied to the kth initialization scan line GILk. In the first period t1, the first transistor ST1 is turned on by the kth initialization scan signal GISk having the first-level voltage V1. Due to the turn-on of the first transistor ST1, the initialization voltage Vini of the initialization voltage line VIL is applied to the gate electrode of the driving transistor DT.

A driving current (Ids) curve of the driving transistor DT may be positively shifted in a case that the light emitting element LEL displays black luminance and negatively shifted in a case that the light emitting element LEL displays white luminance. In a case that the light emitting element LEL displays black luminance and then white luminance, the driving current (Ids) curve of the driving transistor DT may gradually be negatively shifted. Therefore, even if the same data voltage is applied, the driving current Ids of the driving transistor DT which is supplied to the light emitting element LEL increases in a staircase manner. Accordingly, the luminance of light emitted by the light emitting element LEL also increases in a staircase manner.

To reduce a luminance difference between frame periods resulting from a staircase-like increase in the luminance of the light emitting element LEL due to hysteresis characteristics of the driving transistor DT, an on-bias is applied to the driving transistor DT in the first period t1. When the initialization voltage Vini is applied to the gate electrode of the driving transistor DT in the first period t1, the driving transistor DT may be turned on because a voltage between the gate electrode and the first electrode of the driving transistor DT is smaller than the threshold voltage Vth of the driving transistor DT. For example, the on-bias may be applied to the driving transistor DT.

Second, in the second period t2, the kth write scan signal GWSk having the first-level voltage V1 is supplied to the kth write scan line GWLk. In the second period t2, each of the second transistor ST2 and the third transistor ST3 is turned on by the kth write scan signal GWSk having the first-level voltage V1.

In the second period t2, due to the turn-on of the third transistor ST3, the gate electrode and the second electrode of the driving transistor DT may be electrically connected to each other, and the driving transistor DT operates as a diode. Due to the turn-on of the second transistor ST2, a data voltage Vdata is supplied to the first electrode of the driving transistor DT. Here, since the voltage (Vgs=Vini−Vdata) between the gate electrode and the first electrode of the driving transistor DT is smaller than the threshold voltage Vth, the driving transistor DT may form a current path until the voltage Vgs between the gate electrode and the first electrode of the driving transistor DT reaches the threshold voltage Vth. Accordingly, in the second period t2, the gate electrode and the second electrode of the driving transistor DT rise to a voltage (Vdata+Vth) which is the sum of the data voltage Vdata and the threshold voltage Vth of the driving transistor DT. "Vdata+Vth" may be stored in the capacitor C1.

Since the driving transistor DT is formed as a P-type MOSFET, the driving current Ids of the driving transistor DT may be inversely proportional to the voltage Vgs between the gate electrode and the first electrode of the driving transistor DT in a section in which the voltage Vgs between the gate electrode and the first electrode of the driving transistor DT is smaller than 0 V. Also, since the driving transistor DT is formed as a P-type MOSFET, the threshold voltage Vth may be smaller than 0 V.

In the second period t2, the kth bias scan signal GBSk having the first-level voltage V1 is supplied to the kth bias scan line GBLk. Therefore, in the second period t2, the fourth transistor ST4 is turned on by the kth bias scan signal GBSk having the first-level voltage V1. Due to the turn-on of the fourth transistor ST4, the anode AND of the light emitting element LEL may be initialized to the initialization voltage Vini of the initialization voltage line VIL.

Third, during the third period t3, the kth emission signal EMk having the first-level voltage V1 is supplied to the kth emission line ELk. During the third period t3, each of the fifth transistor ST5 and the sixth transistor ST6 is tuned on by the kth emission signal EMk having the first-level voltage V1.

Due to the turn-on of the fifth transistor ST5, the first electrode of the driving transistor DT may be electrically connected to the first driving voltage line VDDL. Due to the turn-on of the sixth transistor ST6, the second electrode of the driving transistor DT may be electrically connected to the anode AND of the light emitting element LEL.

When the fifth transistor ST5 and the sixth transistor ST6 are turned on, the driving current Ids flowing according to the voltage of the gate electrode of the driving transistor DT may be supplied to the light emitting element LEL. The driving current Ids may be defined as Equation 2.

$$Ids=k'\times\{(Vdata+Vth-ELVDD)-Vth)\}^2 \quad (2).$$

In Equation 2, k' is a proportional coefficient determined by the structure and physical properties of the driving transistor DT, Vth is the threshold voltage of the driving transistor DT, ELVDD is the first driving voltage of the first driving voltage line VDDL, and Vdata is a data voltage. A gate voltage of the driving transistor DT is (Vdata+Vth), and the voltage of the first electrode is ELVDD. Equation 2 may be summarized into Equation 3.

$$Ids=k'\times(Vdata-ELVDD)^2 \quad (3).$$

Ultimately, as shown in Equation 3, the driving current Ids does not depend on the threshold voltage Vth of the driving transistor DT. For example, the threshold voltage Vth of the driving transistor DT may be compensated for.

The operation of the load matching transistors LMT will now be described in detail with reference to FIGS. 3 and 9.

A load matching transistor LMT to which the kth load matching control signal LMSk is transmitted may be electrically connected to the kth write scan line GWLk to which the kth write scan signal GWSk is transmitted. Since the pulse of the kth write scan signal GWSk and the pulse of the kth load matching control signal LMSk are generated simultaneously, the load matching transistor LMT electrically connected to the kth write scan line GWLk may be turned on during a period in which the kth write scan signal GWSk of the first-level voltage V1 is transmitted. Therefore, during the period in which the kth write scan signal GWSk of the first-level voltage V1 is transmitted, the kth write scan line GWLk may be electrically connected to the dummy pixels DPX through the common connection line CSL.

For example, during the period in which the kth write scan signal GWSk of the first-level voltage V1 is transmitted, the kth write scan line GWLk may be electrically connected to the subpixels PX and the dummy pixels DPX. Therefore, during the period in which the kth write scan signal GWSk of the first-level voltage V1 is transmitted, a load applied to the kth write scan line GWLk may include not only a load applied to the subpixels PX of the second display area DA2 but also a load applied to the dummy pixels DPX of the first non-display area NDA1.

A load matching transistor LMT to which the (k+1)th load matching control signal LMSk+1 is transmitted may be electrically connected to the (k+1)th write scan line to which the (k+1)th write scan signal GWSk+1 is transmitted. Since a pulse of the (k+1)th write scan signal GWSk+1 and a pulse of the (k+1)th load matching control signal LMSk+1 are generated simultaneously, the load matching transistor LMT electrically connected to the (k+1)th write scan line may be turned on during a period in which the (k+1)th write scan signal GWSk+1 of the first-level voltage V1 is transmitted. Therefore, during the period in which the (k+1)th write scan signal GWSk+1 of the first-level voltage V1 is transmitted, the (k+1)th write scan line may be electrically connected to the dummy pixels DPX through the common connection line CSL.

For example, during the period in which the (k+1)th write scan signal GWSk+1 of the first-level voltage V1 is transmitted, the (k+1)th write scan line may be electrically connected to the subpixels PX and the dummy pixels DPX. Therefore, during the period in which the (k+1)th write scan signal GWSk+1 of the first-level voltage V1 is transmitted, a load applied to the (k+1)th write scan line may include not only a load applied to the subpixels PX of the second display area DA2 but also a load applied to the dummy pixels DPX of the first non-display area NDA1.

As illustrated in FIGS. 3 and 9, during the period in which the kth write scan signal GWSk of the first-level voltage V1 is transmitted to the kth write scan line GWLk of the second display area DA2 or the third display area DA3, the kth load matching control signal LMSk of the first-level voltage V1 may be transmitted to the load matching transistor LMT electrically connected to the kth write scan line GWLk, thereby turning on the load matching transistor LMT. In this case, the load applied to the kth write scan line GWLk may include not only the load applied to the subpixels PX of the second display area DA2 but also the load applied to the dummy pixels DPX of the first non-display area NDA1. Thus, the load applied to the write scan lines GWL of the second display area DA2 may be compensated for through the dummy pixels DPX of the first non-display area NDA1. Therefore, a difference between the load applied to the write scan lines GWL in the second display area DA2 and the load applied to the write scan lines GWL in the first display area DA1 may be minimized. Accordingly, this may reduce a difference between the pulse widths of the write scan signals of the write scan lines GWL of the second display area DA2 and the third display area DA3 and the pulse widths of the write scan signals of the write scan lines GWL of the first display area DA1, thereby preventing a difference in luminance between the subpixels PX.

In order for the write scan signals GWSk and GWSk+1 output from the first scan driving circuit 111 and the load matching control signals LMSk and LMSk+1 output from the first load matching driving circuit 130 to be substantially the same, scan clock signals input to the first scan driving circuit 111 through the first scan timing lines SCL1 (see FIG. 2) and load matching clock signals input to the first load matching driving circuit 130 through the first load timing lines LTL1 may be substantially the same. In this case, a scan start signal input to the first scan driving circuit 111 through the first scan timing lines SCL1 (see FIG. 2) and a load matching start signal input to the first load matching driving circuit 130 through the first load timing lines LTL1 may be substantially the same or different.

For example, the first scan driving circuit 111 may output the write scan signals GWSk and GWSk+1 starting from the upper side of the display panel 100 where the notch NTA may be formed, and the first load matching driving circuit 130 may output the load matching control signals LMSk and LMSk+1 starting from the upper side of the display panel 100. In this case, a first write scan signal output from the first scan driving circuit 111 and a first load matching control signal output from the first load matching driving circuit 130 should be output simultaneously. Therefore, the scan start signal input to the first scan driving circuit 111 through the first scan timing lines SCL1 (see FIG. 2) and the load matching start signal input to the first load matching driving circuit 130 through the first load timing lines LTL1 may be substantially the same.

Alternatively, the first scan driving circuit 111 may output the write scan signals GWSk and GWSk+1 starting from the lower side of the display panel 100 where the display pads DP are disposed, and the first load matching driving circuit 130 may output the load matching control signals LMSk and LMSk+1 starting from the lower side of the second display area DA2. In this case, the first write scan signal output from the first scan driving circuit 111 and the first load matching control signal output from the first load matching driving circuit 130 are not simultaneously output. Therefore, the scan start signal input to the first scan driving circuit 111 through the first scan timing lines SCL1 (see FIG. 2) and the load matching start signal input to the first load matching driving circuit 130 through the first load timing lines LTL1 may be different.

Figure 10:
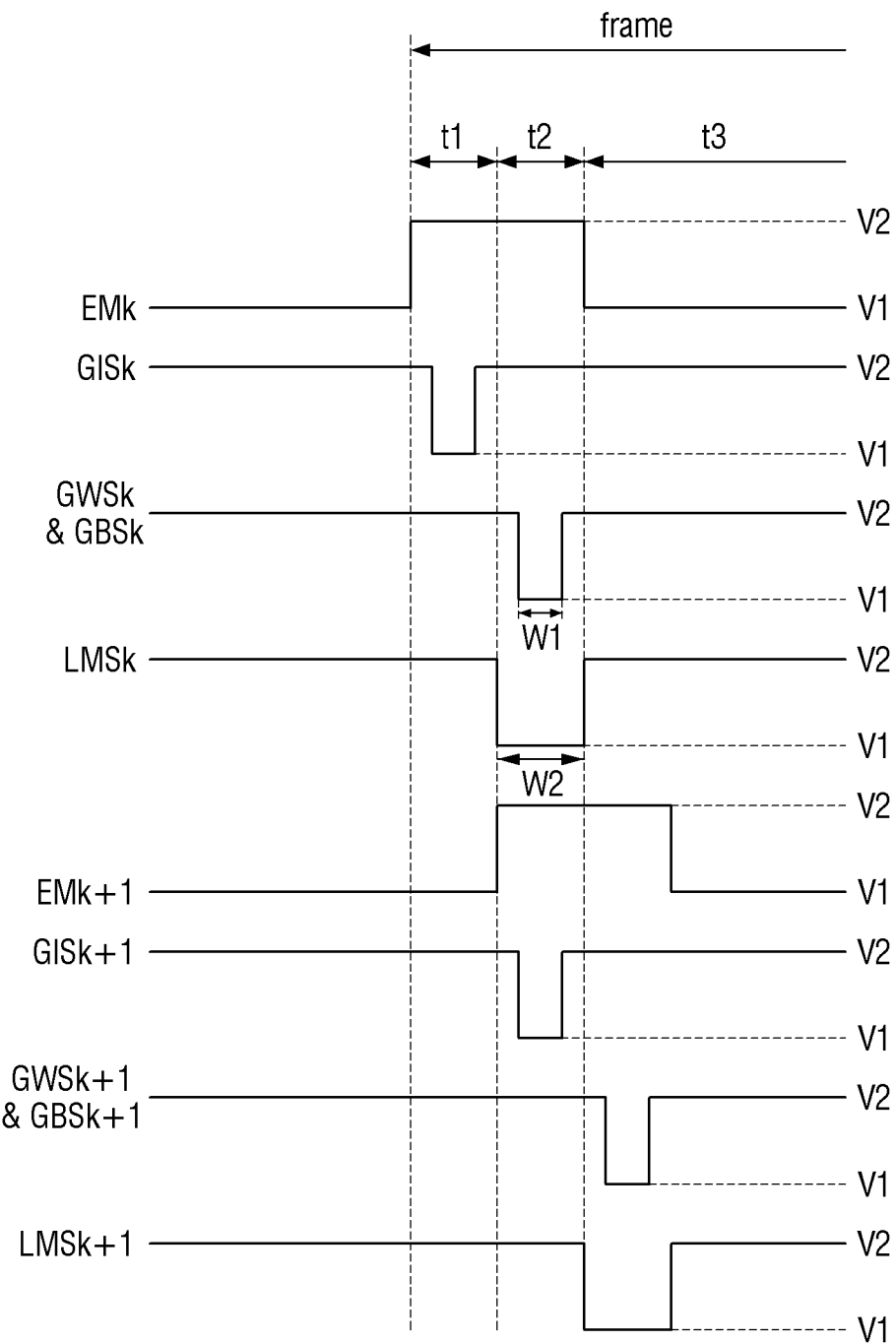
FIG. 10 is a waveform diagram illustrating initialization scan signals, write scan signals, bias scan signals, emission signals, and load matching control signals according to an embodiment.

FIG. 10 is a waveform diagram illustrating initialization scan signals, write scan signals, bias scan signals, emission signals, and load matching control signals according to an embodiment.

An embodiment of FIG. 10 may be different from an embodiment of FIG. 9 in that a pulse width of each of load matching control signals LMSk and LMSk+1 may be greater than a pulse width of each of write scan signals GWSk and GWSk+1.

Referring to FIG. 10, a pulse of a kth write scan signal GWSk may have a first pulse width W1, and a pulse of a kth load matching control signal LMSk may have a second pulse width W2 greater than the first pulse width W1. Therefore, the pulse of the kth write scan signal GWSk may completely overlap the pulse of the kth load matching control signal LMSk.

The load matching transistor LMT electrically connected to the kth write scan line GWLk may be turned on by the kth load matching control signal LMSk of the first-level voltage V1 before the kth write scan signal GWSk of the first-level voltage V1 is transmitted to the subpixels PX of the second display area DA2 or the third display area DA3. In this case, when the kth write scan signal GWSk of the first-level voltage V1 is transmitted to the kth write scan line GWLk, the kth write scan line GWLk may be electrically connected not only to the subpixels PX of the second display area DA2 but also to the dummy pixels DPX through the common scan line CSL. Therefore, a load applied to the kth write scan line GWLk may include not only a load applied to the subpixels PX of the second display area DA2 but also a load applied to the dummy pixels DPX of the first non-display area NDA1.

For example, the load applied to the write scan lines GWL of the second display area DA2 may be compensated for through the dummy pixels DPX of the first non-display area NDA1. Therefore, a difference between the load applied to the write scan lines GWL in the second display area DA2 and the load applied to the write scan lines GWL in the first display area DA1 may be minimized. Accordingly, this may reduce a difference between the pulse widths of the write scan signals of the write scan lines GWL of the second display area DA2 and the third display area DA3 and the pulse widths of the write scan signals of the write scan lines GWL of the first display area DA1, thereby preventing a difference in luminance between the subpixels PX.

In order for the write scan signals GWSk and GWSk+1 output from the first scan driving circuit 111 and the load matching control signals LMSk and LMSk+1 output from the first load matching driving circuit 130 to be different, scan clock signals input to the first scan driving circuit 111 through the first scan timing lines SCL1 and load matching clock signals input to the first load matching driving circuit 130 through the first load timing lines LTL1 may be different. In this case, a scan start signal input to the first scan driving circuit 111 through the first scan timing lines SCL1 and a load matching start signal input to the first load matching driving circuit 130 through the first load timing lines LTL1 may be different.

Figure 11:
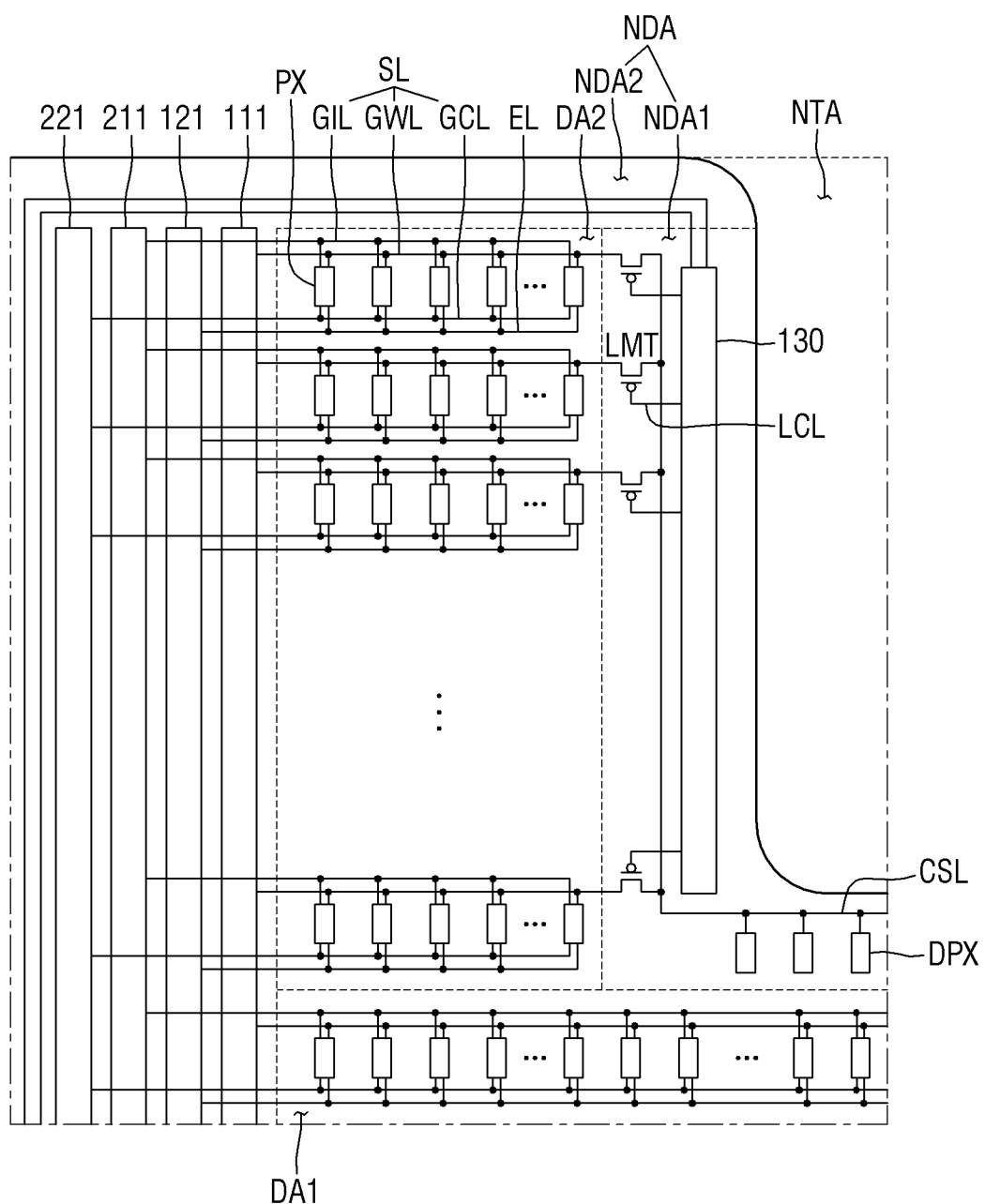
FIG. 11 is a detailed layout view illustrating an example of the first display area, the second display area, the first non-display area and the second non-display area of the display panel of FIG. 2.

FIG. 11 is a detailed layout view illustrating an example of the first display area DA1, the second display area DA2, the first non-display area NDA1 and the second non-display area NDA2 of the display panel 100 of FIG. 2.

An embodiment of FIG. 11 may be different from an embodiment of FIG. 3 in that a first scan driving circuit 111 may output only write scan signals to write scan lines GWL, and a first initialization driving circuit 211 for outputting initialization scan signals to initialization scan lines GIL and a first control driving circuit 221 for outputting control scan signals to control scan lines GCL may be added.

Referring to FIG. 11, the first scan driving circuit 111 may be electrically connected to the write scan lines GWL. The first scan driving circuit 111 may be electrically connected to display pads DP through first scan timing lines SCL1 (see FIG. 2). The first scan driving circuit 111 may generate write scan signals based on first scan timing signals of a display driver 200 received through the first scan timing lines SCL1 (see FIG. 2). The first scan driving circuit 111 may sequentially output the write scan signals to the write scan lines GWL.

The first initialization driving circuit 211 may be electrically connected to the initialization scan lines GIL. The first initialization driving circuit 211 may be electrically connected to the display pads DP through first initialization timing lines. The first scan driving circuit 111 may generate initialization scan signals based on first initialization timing signals of the display driver 200 received through the first initialization timing lines. The first initialization driving circuit 211 may sequentially output the initialization scan signals to the initialization scan lines GIL.

The first control driving circuit 221 may be electrically connected to the control scan lines GCL. The first control driving circuit 221 may be electrically connected to the display pads DP through first control timing lines. The first control driving circuit 221 may generate control scan signals based on first control timing signals of the display driver 200 received through the first control timing lines. The first control driving circuit 221 may sequentially output the control scan signals to the control scan lines GCL.

A third display area DA3 of the display panel 100 may be substantially the same as a second display area DA2 described above with reference to FIG. 11 except that left and right sides of the second display area DA2 of the display panel 100 illustrated in FIG. 11 are reversed.

Figure 12:
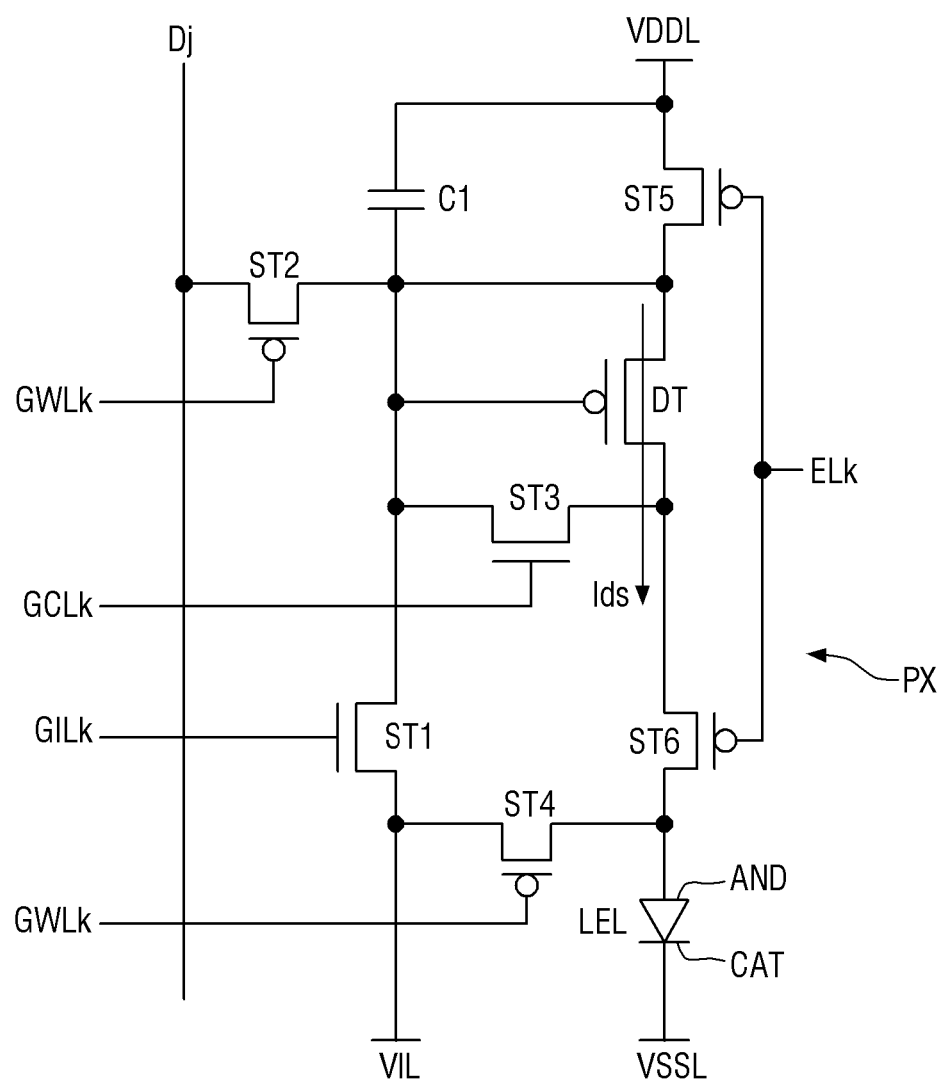
FIG. 12 is an equivalent circuit diagram of an example of a subpixel of FIG. 11.

FIG. 12 is an equivalent circuit diagram of an example of a subpixel PX of FIG. 11.

An embodiment of FIG. 12 may be different from an embodiment of FIG. 4 in that a driving transistor DT, a second transistor ST2, a fourth transistor ST4, a fifth transistor ST5 and a sixth transistor ST6 may be formed as P-type MOSFETs, and a first transistor ST1 and a third transistor ST3 may be formed as N-type MOSFETs.

The driving transistor DT, the second transistor ST2, the fourth transistor ST4, the fifth transistor ST5, the sixth transistor ST6 and a capacitor C1 illustrated in FIG. 12 are substantially the same as the driving transistor DT, the second transistor ST2, the fifth transistor ST5, the sixth transistor and the capacitor C1 illustrated in FIG. 4, and thus a description thereof will be omitted.

Referring to FIG. 12, the first transistor ST1 is turned on by an initialization scan signal of a kth initialization scan line GILk to electrically connect a gate electrode of the driving transistor DT and an initialization voltage line VIL. The gate electrode of the driving transistor DT may be discharged to an initialization voltage of the initialization voltage line VIL. The first transistor ST1 may have a gate electrode electrically connected to the kth initialization scan line GILk, a first electrode electrically connected to the gate electrode of the driving transistor DT, and a second electrode electrically connected to the initialization voltage line VIL.

The third transistor ST3 is turned on by a control scan signal of a kth control scan line GCLk to electrically connect the gate electrode and a second electrode of the driving transistor DT. For example, since the gate electrode and the second electrode of the driving transistor DT may be electrically connected when the third transistor ST3 may be turned on, the driving transistor DT may operate as a diode. The third transistor ST3 may have a gate electrode electrically connected to the kth control scan line GCLk, a first electrode electrically connected to the second electrode of the driving transistor DT, and a second electrode electrically connected to the gate electrode of the driving transistor DT.

The fourth transistor ST4 is turned on by a write scan signal of a kth write scan line GWLk to electrically connect an anode AND of a light emitting element LEL and the initialization voltage line VIL. The anode AND of the light emitting element LEL may be discharged to the initialization voltage. The fourth transistor ST4 has a gate electrode electrically connected to the kth write scan line GWLk, a first electrode electrically connected to the anode AND of the light emitting element LEL, and a second electrode electrically connected to the initialization voltage line VIL.

An active layer of each of the driving transistor DT, the second transistor ST2, the fourth transistor ST4, the fifth transistor ST5 and the sixth transistor ST6 formed as P-type MOSFETs may be made of polysilicon, and an active layer of each of the first transistor ST1 and the third transistor ST3 formed as N-type MOSFETs may be made of an oxide semiconductor.

Figure 13:
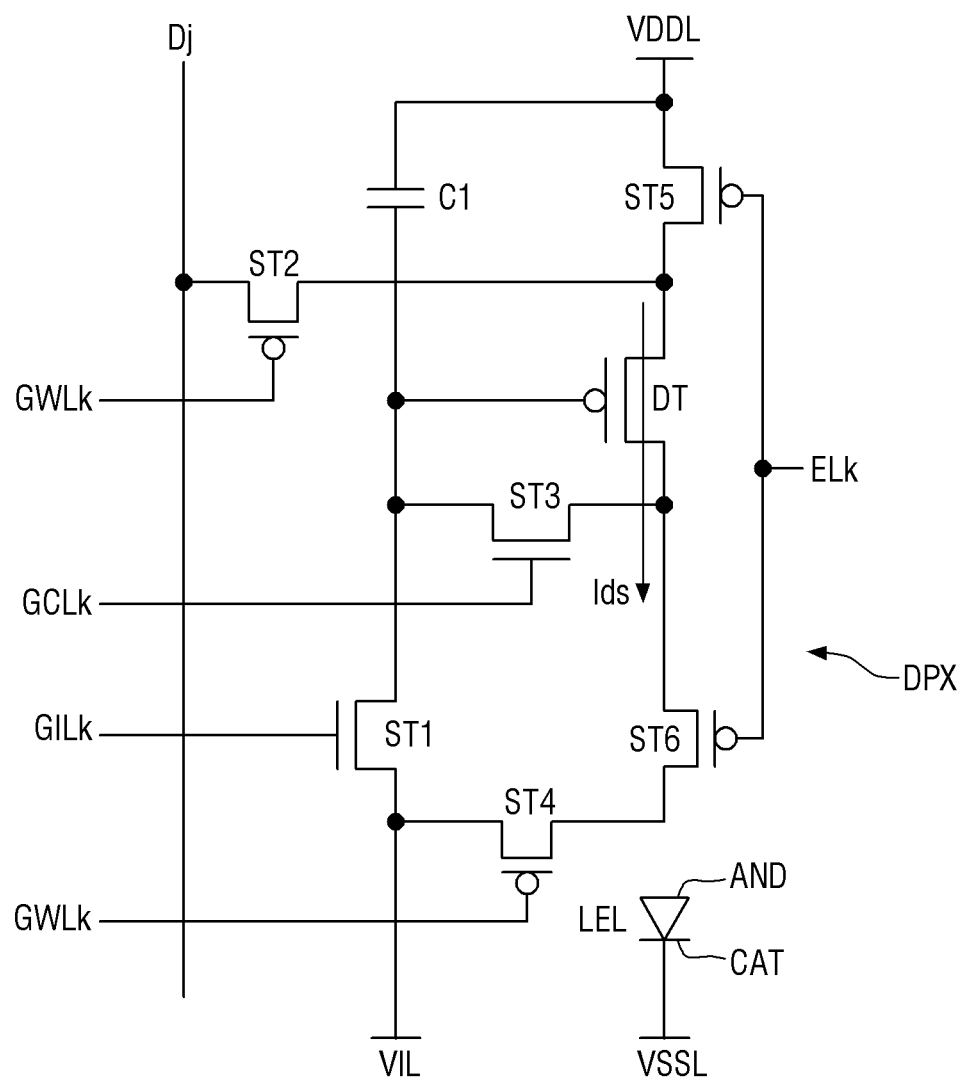
FIG. 13 is an equivalent circuit diagram of an example of a dummy pixel of FIG. 11.

FIG. 13 is an equivalent circuit diagram of an example of a dummy pixel DPX of FIG. 11.

An embodiment of FIG. 13 may be different from an embodiment of FIG. 12 in that a second electrode of a sixth transistor ST6 and an anode AND of a light emitting element LEL may be physically or electrically disconnected.

Referring to FIG. 13, since a driving current Ids does not flow through the light emitting element LEL of the dummy pixel DPX, the light emitting element LEL does not emit light. For example, a driving transistor DT and first through sixth transistors ST1 through ST6 of the dummy pixel DPX may operate in the same way as the driving transistor DT and the first through sixth transistors ST1 through ST6 of the subpixel PX. However, since the second electrode of the sixth transistor ST6 and the anode AND of the light emitting element LEL are physically or electrically disconnected, the driving current Ids does not flow through the light emitting element LEL.

As illustrated in FIG. 13, the dummy pixel DPX has a load similar to that of the subpixel PX without emitting light to display an image. Therefore, the dummy pixel DPX may be used as a pixel for compensating for a load applied to the write scan lines GWL of the second display area DA2.

Figure 14:
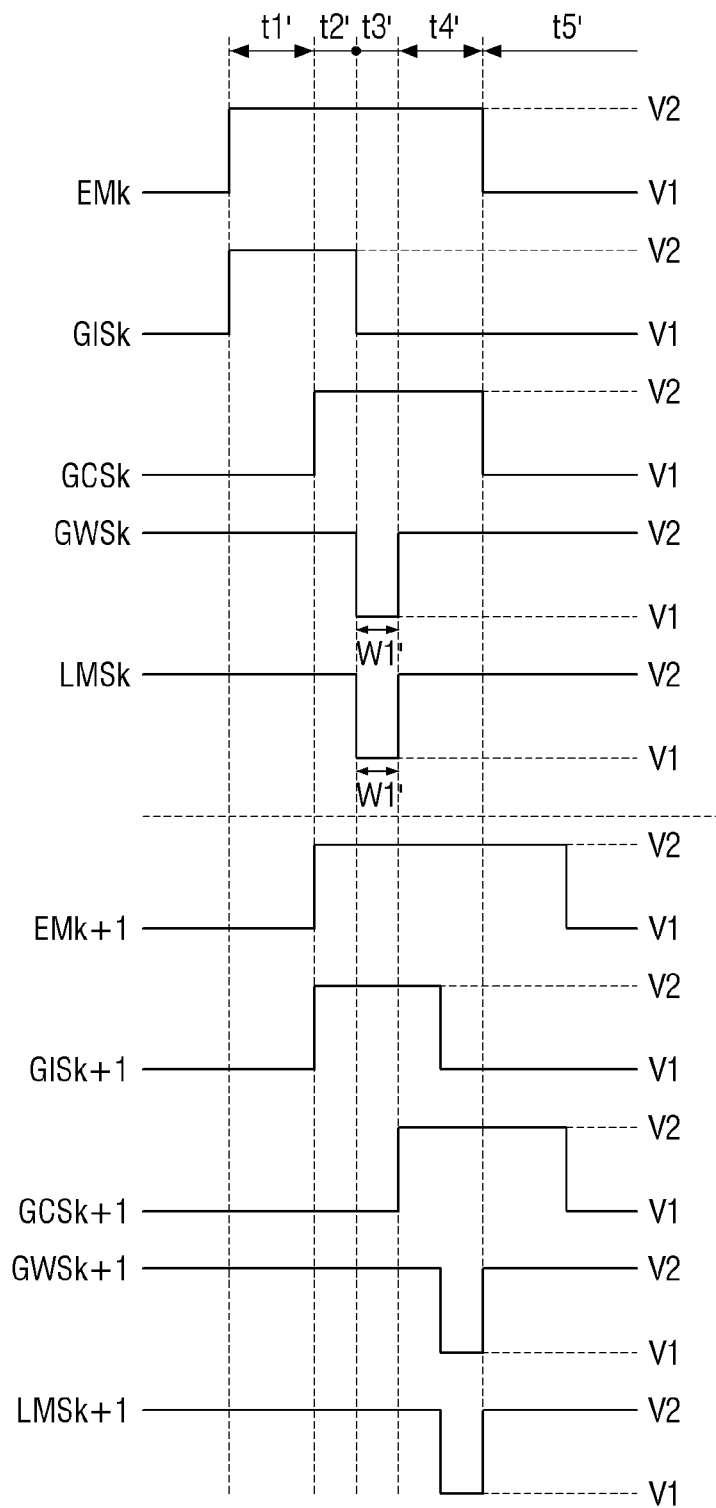
FIG. 14 is a waveform diagram illustrating initialization scan signals, write scan signals, control scan signals, emission signals, and load matching control signals according to an embodiment.

FIG. 14 is a waveform diagram illustrating initialization scan signals, write scan signals, control scan signals, emission signals, and load matching control signals according to an embodiment.

FIG. 14 illustrates a kth initialization scan signal GISk transmitted to the kth initialization scan line GILk, a (k+1)th initialization scan signal GISk+1 transmitted to a (k+1)th initialization scan line, a kth write scan signal GWSk transmitted to the kth write scan line GWLk, a (k+1)th write scan signal GWSk+1 transmitted to a (k+1)th write scan line, a kth control scan signal GCSk transmitted to the kth control scan line GCLk, a (k+1)th control scan signal GCSk+1 transmitted to a (k+1)th control scan line, a kth emission signal EMk transmitted to a kth emission line ELk, a (k+1)th emission signal EMk+1 transmitted to a (k+1)th emission line, a kth load matching control signal LMSk transmitted to a kth load matching control line LCLk, and a (k+1)th load matching control signal LMSk+1 transmitted to a (k+1)th load matching control line LCLk+1.

The initialization scan signals GISk and GISk+1 are signals for controlling on/off of the first transistor ST1. The write scan signals GWSk and GWSk+1 are signals for controlling on/off of each of the second transistor ST2 and the fourth transistor ST4. The control scan signals GCSk and GCSk+1 are signals for controlling on/off of the third transistor ST3. The emission signals EMk and EMk+1 are signals for controlling on/off of the fifth transistor ST5 and the sixth transistor ST6. The kth load matching control signal LMSk and the (k+1)th load matching control signal LMSk+1 are signals for controlling load matching transistors LMT. The initialization scan signals GISk and GISk+1, the write scan signals GWSk and GWSk+1, the control scan signals GCSk and GCSk+1, the emission signals EMk and EMk+1, and the load matching control signals LMSk and LMSk+1 may be generated at intervals of one frame period.

One frame period may include first through fifth periods t1' through t5'. The first period t1' is a period of time during which an on-bias is applied to the driving transistor DT by applying the initialization voltage Vini to the gate electrode of the driving transistor DT, the second period t2' is a preparation period for diode-connecting the driving transistor DT, the third period t3' is a period of time during which a data voltage is supplied, the fourth period t4' is a period of time during which a threshold voltage of the driving transistor DT is sampled, and the fifth period t5' is a period of time during which the light emitting element LEL emits light according to the voltage of the gate electrode of the driving transistor DT.

The kth initialization scan signal GISk may be output as a second-level voltage V2 during the first period t1' and the second period t2' and may be output as a first-level voltage V1 during the third through fifth periods t3' through t5'. The kth write scan signal GWSk and the kth load matching control signal LMSk may have the first-level voltage V1 during the third period t3' and may have the second-level voltage V2 during the first period t1', the second period t2', the fourth period t4' and the fifth period t5'. The kth control scan signal GCSk may have the first-level voltage V1 during the first period t1' and second period t2' and have the second-level voltage V2 during the third through fifth periods t2' through t5'. The kth emission signal EMk may have the first-level voltage V1 during the first through fourth periods t1' through t4' and have the second-level voltage V2 during the fifth period t5'.

A pulse of the kth write scan signal GWSk and a pulse of the kth load matching control signal LMSk may be generated during the same period. A pulse width of the kth write scan signal GWSk and a pulse width of the kth load matching control signal LMSk may be substantially equal. For example, as illustrated in FIG. 14, the pulse width of the kth write scan signal GWSk and the pulse width of the kth load matching control signal LMSk may all be a first pulse width W1'. The first pulse width W1' may be substantially equal to the third period t3'. The pulse of the kth write scan signal GWSk may be defined as the kth write scan signal GWSk generated as the first-level voltage V1. The pulse of the kth load matching control signal LMSk may be defined as the kth load matching control signal LMSk generated as the first-level voltage V1.

The first-level voltage V1 corresponds to a voltage that can turn on each of the second transistor ST2, the fourth transistor ST4, the fifth transistor ST5 and the sixth transistor ST6 formed as P-type MOSFETs. The second-level voltage V2 corresponds to a voltage that can turn on each of the first transistor ST1 and the third transistor ST3 formed as N-type MOSFETs. The first-level voltage V1 may be about −8 V, and the second-level voltage V2 may be 7 V.

The operation of the subpixel PX during the first through fifth periods t1' through t5' will now be described in detail with reference to FIGS. 12 and 14.

First, in the first period t1', the kth initialization scan signal GISk having the second-level voltage V2 is supplied to the kth initialization scan line GILk. In the first period t1', the first transistor ST1 is turned on by the kth initialization scan signal GISk having the second-level voltage V2. Due to the turn-on of the first transistor ST1, the initialization voltage Vini of the initialization voltage line VIL is applied to the gate electrode of the driving transistor DT.

A driving current (Ids) curve of the driving transistor DT may be positively shifted in a case that the light emitting element LEL displays black luminance and negatively shifted in a case that the light emitting element LEL displays white luminance. In a case that the light emitting element LEL displays black luminance and then white luminance, the driving current (Ids) curve of the driving transistor DT may gradually be negatively shifted. Therefore, even if the same data voltage is applied, the driving current Ids of the driving transistor DT which is supplied to the light emitting element LEL increases in a staircase manner. Accordingly, the luminance of light emitted by the light emitting element LEL also increases in a staircase manner.

To reduce a luminance difference between frame periods resulting from a staircase-like increase in the luminance of the light emitting element LEL due to hysteresis characteristics of the driving transistor DT, an on-bias is applied to the driving transistor DT in the first period t1'. When the initialization voltage Vini is applied to the gate electrode of the driving transistor DT in the first period t1', the driving transistor DT may be turned on because a voltage between the gate electrode and a first electrode of the driving transistor DT is smaller than the threshold voltage Vth of the driving transistor DT. For example, the on-bias may be applied to the driving transistor DT.

Second, in the second period t2', the kth initialization scan signal GISk having the second-level voltage V2 is supplied to the kth initialization scan line GILk, and the kth control scan signal GCSk having the second-level voltage V2 is supplied to the kth control scan line GCLk. In the second period t2', each of the first transistor ST1 and the third transistor ST3 may be turned.

In the second period t2', due to the turn-on of the third transistor ST3, the gate electrode and the second electrode of the driving transistor DT may be electrically connected to each other, and the driving transistor DT may operate as a diode.

Third, in the third period t3', the kth control scan signal GCSk having the second-level voltage V2 is supplied to the kth control scan line GCLk, and the kth write scan signal GWSk having the first-level voltage V1 is supplied to the kth write scan line GWLk. In the third period t3', each of the second transistor ST2, the third transistor ST3 and the fourth transistor ST4 may be turned.

In the third period t3', due to the turn-on of the second transistor ST2, a data voltage Vdata is supplied to the first electrode of the driving transistor DT. Here, since the voltage (Vgs=Vini−Vdata) between the gate electrode and the first electrode of the driving transistor DT is smaller than the threshold voltage Vth, the driving transistor DT may form a current path until the voltage Vgs between the gate electrode and the first electrode of the driving transistor DT reaches the threshold voltage Vth.

In the third period t3', due to the turn-on of the fourth transistor ST4, the anode AND of the light emitting element LEL may be initialized to the initialization voltage Vini of the initialization voltage line VIL.

Fourth, in the fourth period t4', the kth control scan signal GCSk having the second-level voltage V2 is supplied to the kth control scan line GCLk. In the fourth period t4', the third transistor ST3 may be turned on.

In the fourth period t4', the driving transistor DT may form a current path until the voltage Vgs between the gate electrode and the first electrode reaches the threshold voltage Vth. Therefore, "Vdata+Vth" which is a voltage difference between the gate electrode and the second electrode of the driving transistor DT may be stored in the capacitor C1.

Since the driving transistor DT may be formed as a P-type MOSFET, the driving current Ids of the driving transistor DT may be inversely proportional to the voltage Vgs between the gate electrode and the first electrode of the driving transistor DT in a section in which the voltage Vgs between the gate electrode and the first electrode of the driving transistor DT may be smaller than about 0 V. Also, since the driving transistor DT may be formed as a P-type MOSFET, the threshold voltage Vth may be smaller than about 0 V.

Fifth, during the fifth period t5', the kth emission signal EMk having the first-level voltage V1 is supplied to the kth emission line ELk. During the fifth period t5', each of the fifth transistor ST5 and the sixth transistor ST6 is tuned on by the kth emission signal EMk having the first-level voltage V1.

Due to the turn-on of the fifth transistor ST5, the first electrode of the driving transistor DT may be electrically connected to a first driving voltage line VDDL. Due to the turn-on of the sixth transistor ST6, the second electrode of the driving transistor DT may be electrically connected to the anode AND of the light emitting element LEL.

When the fifth transistor ST5 and the sixth transistor ST6 are turned on, the driving current Ids flowing according to the voltage of the gate electrode of the driving transistor DT may be supplied to the light emitting element LEL. The driving current Ids may be the same as Equation 3.

Ultimately, as shown in Equation 3, the driving current Ids does not depend on the threshold voltage Vth of the driving transistor DT. For example, the threshold voltage Vth of the driving transistor DT may be compensated for.

The operation of the load matching transistors LMT may be substantially the same as that described above with reference to FIGS. 3 and 9. For example, during a period in which the kth write scan signal GWSk of the first-level voltage V1 is transmitted to the kth write scan line GWLk of the second display area DA2 or the third display area DA3, the kth load matching control signal LMSk of the first-level voltage V1 may be transmitted to a load matching transistor LMT electrically connected to the kth write scan line GWLk, thereby turning on the load matching transistor LMT. In this case, a load applied to the kth write scan line GWLk may include not only a load applied to subpixels PX of the second display area DA2 but also a load applied to dummy pixels DPX of a first non-display area NDA1. Thus, the load applied to the write scan lines GWL of the second display area DA2 may be compensated for through the dummy pixels DPX of the first non-display area NDA1. Therefore, a difference between the load applied to the write scan lines GWL in the second display area DA2 and the load applied to the write scan lines GWL in a first display area DA1 may be minimized. Accordingly, this may reduce a difference between pulse widths of write scan signals of the write scan lines GWL of the second display area DA2 and the third display area DA3 and pulse widths of write scan signals of the write scan lines GWL of the first display area DA1, thereby preventing a difference in luminance between the subpixels PX.

Figure 15:
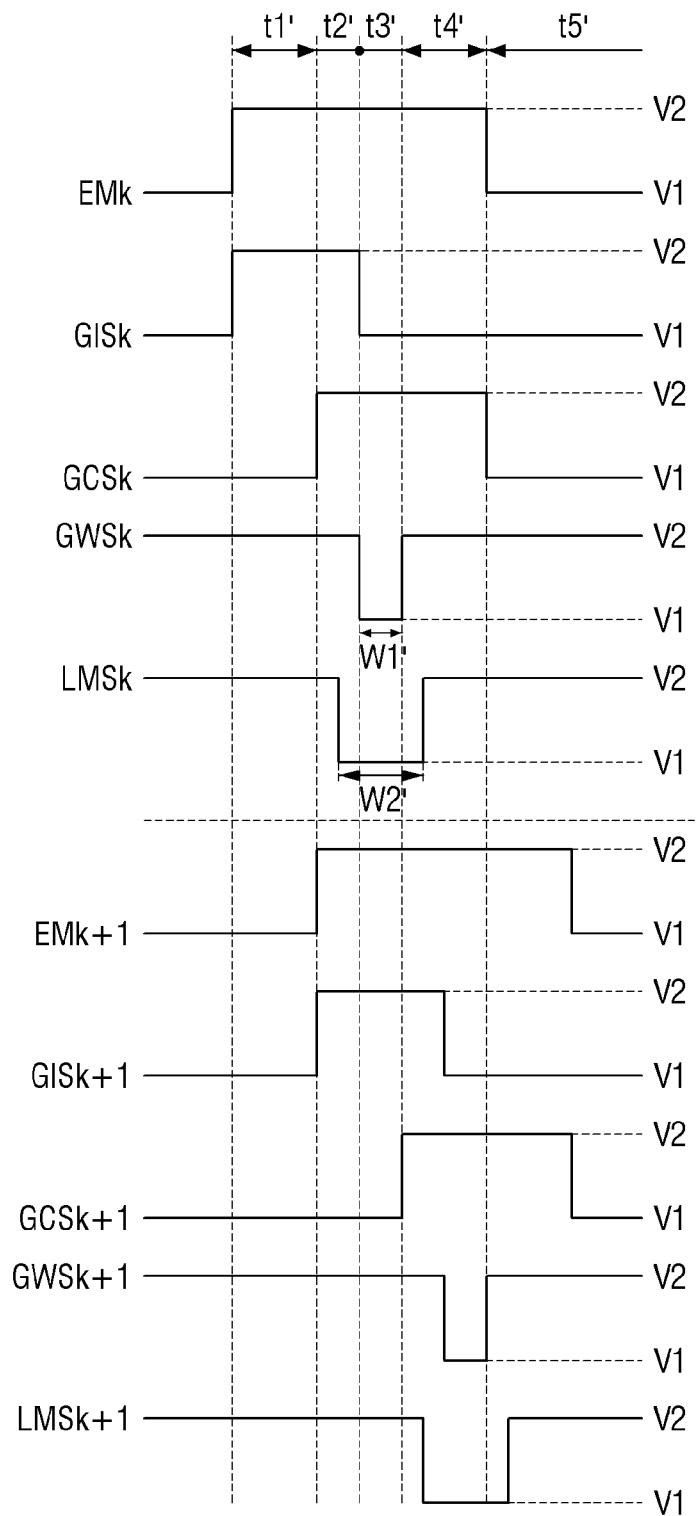
FIG. 15 is a waveform diagram illustrating initialization scan signals, write scan signals, control scan signals, emission signals, and load matching control signals according to an embodiment.

FIG. 15 is a waveform diagram illustrating initialization scan signals, write scan signals, control scan signals, emission signals, and load matching control signals according to an embodiment.

An embodiment of FIG. 15 may be different from an embodiment of FIG. 14 in that a pulse width of each of load matching control signals LMSk and LMSk+1 may be greater than a pulse width of each of write scan signals GWSk and GWSk+1.

Referring to FIG. 15, a pulse of a kth write scan signal GWSk may have a first pulse width W1', and a pulse of a kth load matching control signal LMSk may have a second pulse width W2' greater than the first pulse width W1'. Therefore, the pulse of the kth write scan signal GWSk may completely overlap the pulse of the kth load matching control signal LMSk.

The load matching transistor LMT electrically connected to the kth write scan line GWLk may be turned on by the kth load matching control signal LMSk of the first-level voltage V1 before the kth write scan signal GWSk of the first-level voltage V1 is transmitted to the subpixels PX of the second display area DA2 or the third display area DA3. In this case, when the kth write scan signal GWSk of the first-level voltage V1 is transmitted to the kth write scan line GWLk, the kth write scan line GWLk may be electrically connected not only to the subpixels PX of the second display area DA2 but also to the dummy pixels DPX through a common scan line CSL. Therefore, a load applied to the kth write scan line GWLk may include not only a load applied to the subpixels PX of the second display area DA2 but also a load applied to the dummy pixels DPX of the first non-display area NDA1.

For example, the load applied to the write scan lines GWL of the second display area DA2 may be compensated for through the dummy pixels DPX of the first non-display area NDA1. Therefore, a difference between the load applied to the write scan lines GWL in the second display area DA2 and the load applied to the write scan lines GWL in the first display area DA1 may be minimized. Accordingly, this may reduce a difference between the pulse widths of the write scan signals of the write scan lines GWL of the second display area DA2 and the third display area DA3 and the pulse widths of the write scan signals of the write scan lines GWL of the first display area DA1, thereby preventing a difference in luminance between the subpixels PX.

Figure 16:
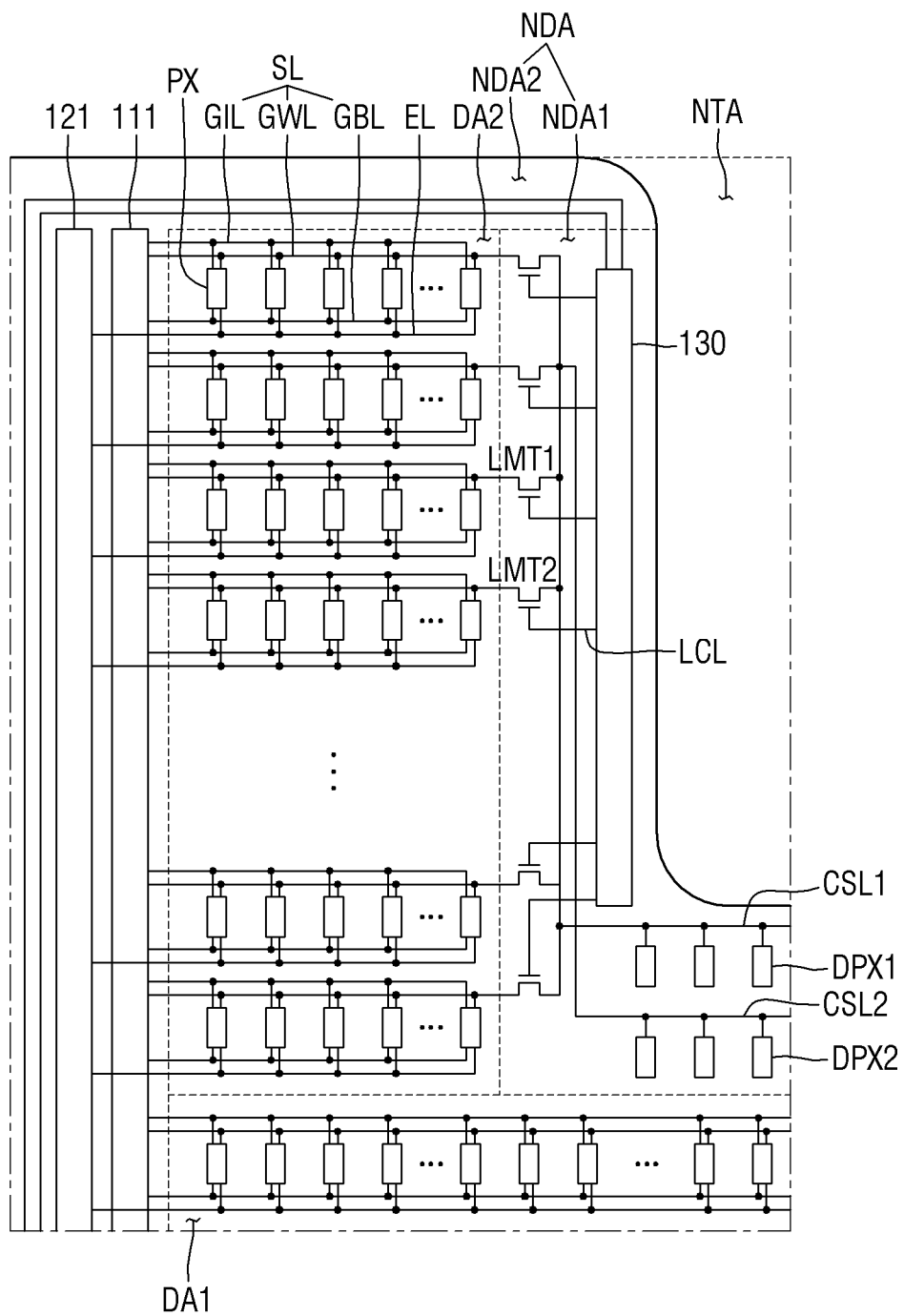
FIG. 16 is a detailed layout view illustrating an example of the first display area, the second display area, the first non-display area and the second non-display area of the display panel of FIG. 2.

FIG. 16 is a detailed layout view illustrating an example of the first display area DA1, the second display area DA2, the first non-display area NDA1 and the second non-display area NDA2 of the display panel 100 of FIG. 2.

An embodiment of FIG. 16 may be different from an embodiment of FIG. 3 in that a first common scan line CSL1 electrically connected to first dummy pixels DPX1 arranged or disposed side by side in the first direction (X-axis direction) and a second common scan line CSL2 electrically connected to second dummy pixels DPX2 arranged or disposed side by side in the first direction (X-axis direction) may be added, first load matching transistors LMT1 may be electrically connected to the first common scan line CSL1, and second load matching transistors LMT2 may be electrically connected to the second common scan line CSL2.

Referring to FIG. 16, the first load matching transistors LMT1 may be disposed between some or a predetermined number of write scan lines GWL and the first common scan line CSL1. For example, the first load matching transistors LMT1 may be disposed between write scan lines GWL disposed in odd-numbered rows and the first common scan line CSL1.

The second load matching transistors LMT2 may be disposed between the other ones of the write scan lines GWL and the second common scan line CSL2. For example, the second load matching transistors LMT2 may be disposed between write scan lines GWL disposed in even-numbered rows and the second common scan line CSL2.

The first load matching transistors LMT1 and the second load matching transistors LMT2 may be turned on/off by load matching control signals. For example, each of the first load matching transistors LMT1 and the second load matching transistors LMT2 may be turned on by a load matching control signal of a second-level voltage V2 and turned off by a load matching control signal of a first-level voltage V1.

Each of the first load matching transistors LMT1 may have a gate electrode electrically connected to a load matching control line LCL, a first electrode electrically connected to a write scan line GWL disposed in an odd-numbered row, and a second electrode electrically connected to the first common scan line CSL1. Each of the second load matching transistors LMT2 may have a gate electrode electrically connected to a load matching control line LCL, a first electrode electrically connected to a write scan line GWL disposed in an even-numbered row, and a second electrode electrically connected to the second common scan line CSL2.

Each of the first load matching transistors LMT1 and the second load matching transistors LMT2 may be formed as a thin-film transistor. Although the first load matching transistors LMT1 and the second load matching transistors LMT2 have been mainly described as N-type MOSFETs, the disclosure is not limited thereto. For example, the first load matching transistors LMT1 and the second load matching transistors LMT2 may also be formed as P-type MOSFETs.

The first load matching transistors LMT1 and the second load matching transistors LMT2 may be alternately disposed in the second direction (Y-axis direction). Since the load matching control signals are sequentially transmitted to the load matching control lines LCL, the first load matching transistors LMT1 and the second load matching transistors LMT2 may be alternately turned on. For example, after a kth write scan line GWL may be electrically connected to the first common scan line CSL1 by the turn-on of a first load matching transistor LMT1, a (k+1)th write scan line GWL may be electrically connected to the second common scan line CSL2 by the turn-on of a second load matching transistor LMT2. Then, after a (k+2)th write scan line GWL may be electrically connected to the first common scan line CSL1 by the turn-on of a first load matching transistor LMT1, a (k+3)th write scan line GWL may be electrically connected to the second common scan line CSL2 by the turn-on of a second load matching transistor LMT2.

The first common scan line CSL1 may be electrically connected to the first dummy pixels DPX1 and the first load matching transistors LMT1. The first common scan line CSL1 may be disposed between the first dummy pixels DPX1 and the first load matching transistors LMT1.

The second common scan line CSL2 may be electrically connected to the second dummy pixels DPX2 and the second load matching transistors LMT2. The second common scan line CSL2 may be disposed between the second dummy pixels DPX2 and the second load matching transistors LMT2.

Since the first dummy pixels DPX1 and the second dummy pixels DPX2 do not display an image, each of the first dummy pixels DPX1 and the second dummy pixels DPX2 may not emit light. The first dummy pixels DPX1 and the second dummy pixels DPX2 may be disposed on an upper side of a first display area DA1. The first dummy pixels DPX1 and the second dummy pixels DPX2 may be disposed on a lower side of a notch NTA. The first dummy pixels DPX1 may be arranged or disposed in the first direction (X-axis direction). The first dummy pixels DPX1 may be electrically connected to the first common scan line CSL1. The second dummy pixels DPX2 may be arranged or disposed in the first direction (X-axis direction). The second dummy pixels DPX2 may be electrically connected to the second common scan line CSL2.

As illustrated in FIG. 16, a first load matching driving circuit 130 may sequentially turn on the first load matching transistors LMT1 and the second load matching transistors LMT2 electrically connected to the write scan lines GWL of a second display area DA2 by sequentially outputting the load matching control signals. Therefore, the write scan lines GWL of the second display area DA2 may be alternately electrically connected to the first dummy pixels DPX1 electrically connected to the first common scan line CSL1 and the second dummy pixels DPX2 electrically connected to the second common scan line CSL2. In this case, a load applied to the write scan lines GWL may include not only a load applied to subpixels PX of the second display area DA2 but also a load applied to the first dummy pixels DPX1 or the second dummy pixels DPX2 of a first non-display area NDA1. Therefore, a difference between the load applied to the write scan lines GWL in the second display area DA2 and the load applied to the write scan lines GWL in the first display area DA1 may be minimized. Accordingly, this may reduce a difference between pulse widths of write scan signals of the write scan lines GWL of the second display area DA2 and a third display area DA3 and pulse widths of write scan signals of the write scan lines GWL of the first display area DA1, thereby preventing a difference in luminance between the subpixels PX.

The third display area DA3 of the display panel 100 may be substantially the same as the second display area DA2 described above with reference to FIG. 16 except that left and right sides of the second display area DA2 of the display panel 100 illustrated in FIG. 16 are reversed.

Figure 17:
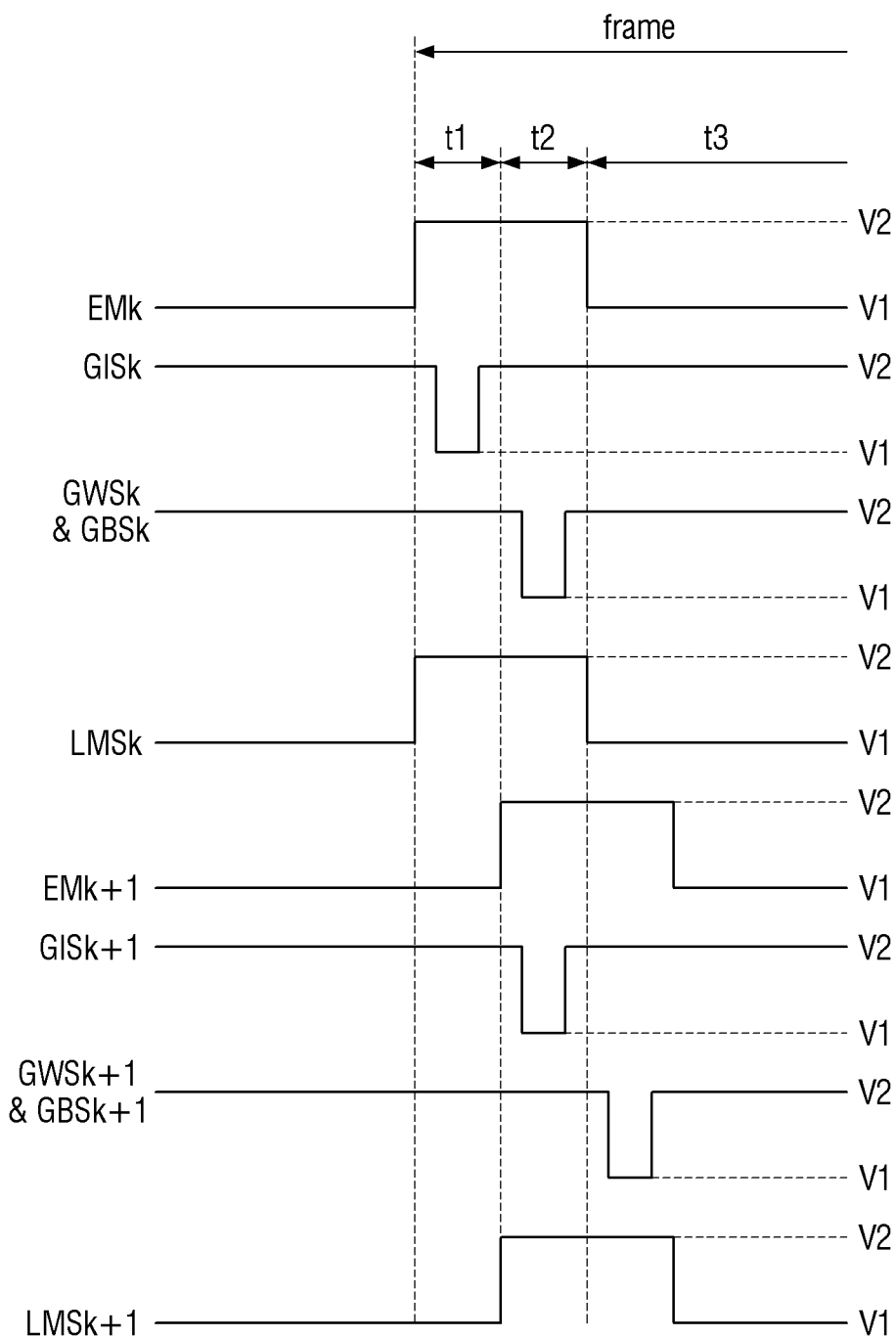
FIG. 17 is a waveform diagram illustrating initialization scan signals, write scan signals, bias scan signals, emission signals, and load matching control signals according to an embodiment.

FIG. 17 is a waveform diagram illustrating initialization scan signals, write scan signals, bias scan signals, emission signals, and load matching control signals according to an embodiment.

An embodiment of FIG. 17 may be different from an embodiment of FIG. 9 in that a pulse of a kth load matching control signal LMSk and a pulse of a kth emission signal EMk may be generated during the same period, and a pulse width of the kth load matching control signal LMSk may be substantially equal to a pulse width of the kth emission signal EMk.

Referring to FIG. 17, a first load matching transistor LMT1 to which the kth load matching control signal LMSk is transmitted may be electrically connected to a kth write scan line GWLk to which a kth write scan signal GWSk is transmitted. A pulse of the kth write scan line GWLk may completely overlap the pulse of the kth load matching control signal LMSk. For example, a pulse width of the kth write scan line GWLk may be smaller than the pulse width of the kth load matching control signal LMSk. Therefore, during a period in which the kth write scan signal GWSk of the first-level voltage V1 is transmitted, the first load matching transistor LMT1 electrically connected to the kth write scan line GWLk may be turned on. Thus, during the period in which the kth write scan signal GWSk of the first-level voltage V1 is transmitted, the kth write scan line GWLk may be electrically connected to the first dummy pixels DPX1 through the first common connection line CSL1.

Here, since the pulse of the kth load matching control signal LMSk also overlaps a pulse of a (k+1)th write scan line, if the first load matching transistor LMT1 electrically connected to the kth write scan line GWLk and a second load matching transistor LMT2 electrically connected to the (k+1)th write scan line may be electrically connected to the same common scan line, the kth write scan line GWLk and the (k+1)th write scan line may be electrically connected to dummy pixels of the same common scan line. In this case, a load applied to the kth write scan line GWLk may be half of a load applied to the subpixels PX and a load applied to the dummy pixels DPX.

To prevent the load applied to the dummy pixels DPX from being halved, as illustrated in FIG. 16, the kth write scan line GWLk may be electrically connected to the first common scan line CSL1 electrically connected to the first dummy pixels DPX1 through the first load matching transistor LMT1, and the (k+1)th write scan line may be electrically connected to the second common scan line CSL2 electrically connected to the second dummy pixels DPX2 through the second load matching transistor LMT2. For example, the kth write scan line GWLk and the (k+1)th write scan line may be electrically connected to different common scan lines.

In order for emission signals EMk and EMk+1 output from a first emission driving circuit 121 and load matching control signals LMSk and LMSk+1 output from the first load matching driving circuit 130 to be substantially the same, emission clock signals input to the first emission driving circuit 121 through first emission timing lines ETL1 (see FIG. 2) and load matching clock signals input to the first load matching driving circuit 130 through first load timing lines LTL1 may be substantially the same. In this case, an emission start signal input to the first emission driving circuit 121 through the first emission timing lines ETL1 (see FIG. 2) and a load matching start signal input to the first load matching driving circuit 130 through the first load timing lines LTL1 may be substantially the same or different.

For example, the first emission driving circuit 121 may output the emission signals EMk and EMk+1 starting from an upper side of the display panel 100 where the notch NTA may be formed, and the first load matching driving circuit 130 may output the load matching control signals LMSk and LMSk+1 starting from the upper side of the display panel 100. In this case, a first emission signal output from the first emission driving circuit 121 and a first load matching control signal output from the first load matching driving circuit 130 should be output simultaneously. Therefore, the emission start signal input to the first emission driving circuit 121 through the first emission timing lines ETL1 (see FIG. 2) and the load matching start signal input to the first load matching driving circuit 130 through the first load timing lines LTL1 may be substantially the same.

Alternatively, the first emission driving circuit 121 may output the emission signals EMk and EMk+1 starting from a lower side of the display panel 100 where display pads DP are disposed, and the first load matching driving circuit 130 may output the load matching control signals LMSk and LMSk+1 starting from a lower side of the second display area DA2. In this case, the first emission signal output from the first emission driving circuit 121 and the first load matching control signal output from the first load matching driving circuit 130 are not simultaneously output. Therefore, the emission start signal input to the first emission driving circuit 121 through the first emission timing lines ETL1 (see FIG. 2) and the load matching start signal input to the first load matching driving circuit 130 through the first load timing lines LTL1 may be different.

Figure 18:
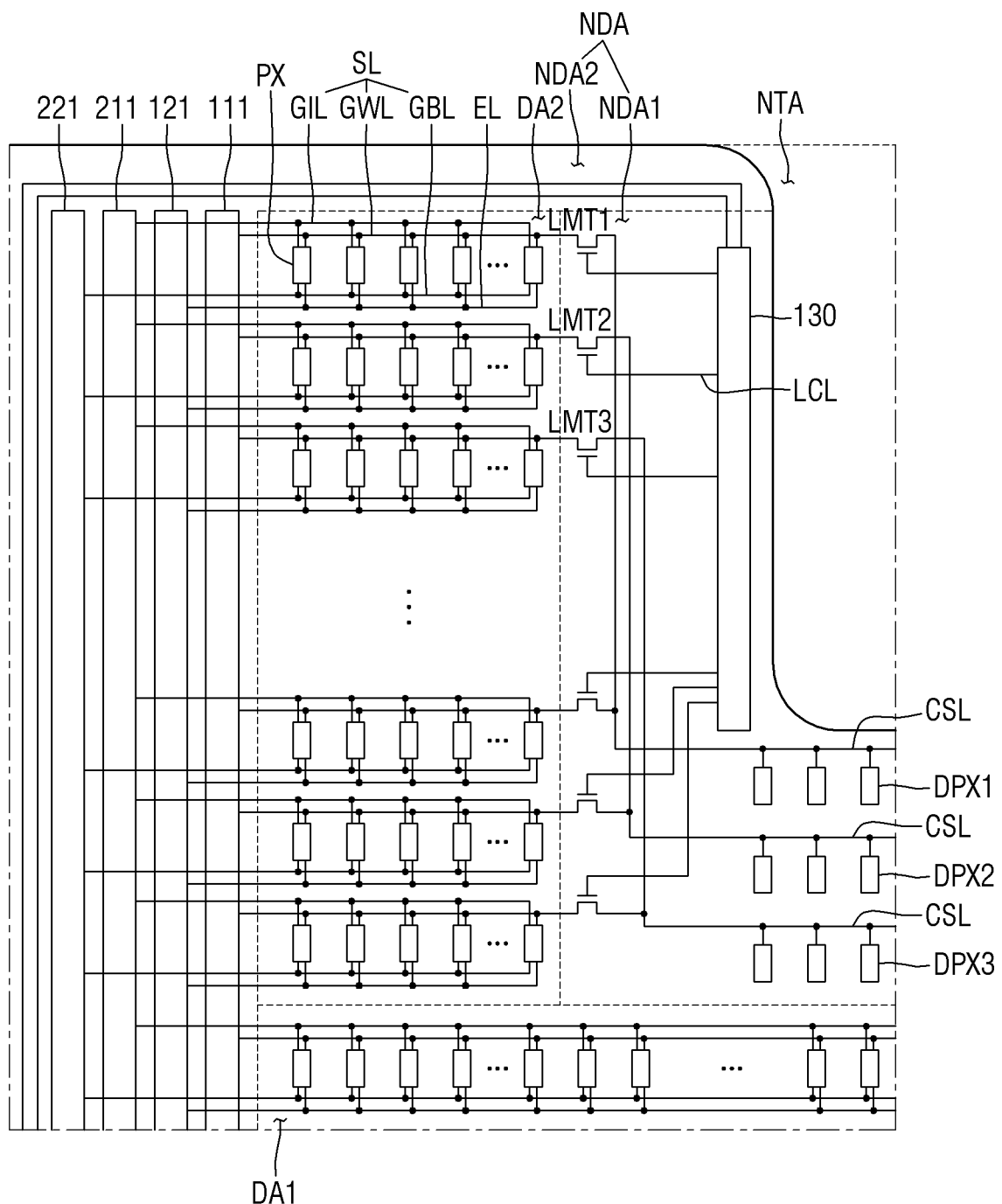
FIG. 18 is a detailed layout view illustrating an example of the first display area, the second display area, the first non-display area and the second non-display area of the display panel of FIG. 2.

FIG. 18 is a detailed layout view illustrating an example of the first display area DA1, the second display area DA2, the first non-display area NDA1 and the second non-display area NDA2 of the display panel 100 of FIG. 2.

An embodiment of FIG. 18 may be different from an embodiment of FIG. 16 in that a first scan driving circuit 111 may output only write scan signals to write scan lines GWL, and a first initialization driving circuit 211 for outputting initialization scan signals to initialization scan lines GIL and a first control driving circuit 221 for outputting control scan signals to control scan lines GCL may be added. An embodiment of FIG. 18 may be different from an embodiment of FIG. 16 in that a third common scan line CSL3 electrically connected to third dummy pixels DPX3 arranged or disposed side by side in the first direction (X-axis direction) may be added, and second load matching transistors LMT2 may be electrically connected to a second common scan line CSL2.

The first scan driving circuit 111, the first initialization driving circuit 211, and the first control driving circuit 221 are substantially the same as those described above with reference to FIG. 11, and thus a description thereof will be omitted.

Referring to FIG. 18, first load matching transistors LMT1, the second load matching transistors LMT2, and third load matching transistors LMT3 may be alternately disposed in the second direction (Y-axis direction). Since load matching control signals are sequentially transmitted to load matching control lines LCL, the first load matching transistors LMT1, the second load matching transistors LMT2, and the third load matching transistors LMT3 may be alternately turned on. For example, after a kth write scan line GWL is electrically connected to a first common scan line CSL1 electrically connected to first dummy pixels DPX1 by the turn-on of a first load matching transistor LMT1, a (k+1)th write scan line GWL may be electrically connected to the second common scan line CSL2 electrically connected to second dummy pixels DPX2 by the turn-on of a second load matching transistor LMT2. Then, a (k+2)th write scan line GWL may be electrically connected to the third common scan line CSL3 electrically connected to the third dummy pixels DPX3 by the turn-on of a third load matching transistor LMT3.

As illustrated in FIG. 18, a first load matching driving circuit 130 may sequentially turn on the first load matching transistors LMT1, the second load matching transistors LMT2 and the third load matching transistors LMT3 electrically connected to the write scan lines GWL of a second display area DA2 by sequentially outputting the load matching control signals. Therefore, the write scan lines GWL of the second display area DA2 may be alternately electrically connected to the first dummy pixels DPX1 electrically connected to the first common scan line CSL1, the second dummy pixels DPX2 electrically connected to the second common scan line CSL2, and the third dummy pixels DPX3 electrically connected to the third common scan line CSL3. In this case, a load applied to the write scan lines GWL may include not only a load applied to subpixels PX of the second display area DA2 but also a load applied to the first dummy pixels DPX1, the second dummy pixels DPX2, or the third dummy pixels DPX3 of a first non-display area NDA1. Therefore, a difference between the load applied to the write scan lines GWL in the second display area DA2 and the load applied to the write scan lines GWL in a first display area DA1 may be minimized. Accordingly, this may reduce a difference between pulse widths of write scan signals of the write scan lines GWL of the second display area DA2 and a third display area DA3 and pulse widths of write scan signals of the write scan lines GWL of the first display area DA1, thereby preventing a difference in luminance between the subpixels PX.

The third display area DA3 of the display panel 100 may be substantially the same as the second display area DA2 described above with reference to FIG. 18 except that left and right sides of the second display area DA2 of the display panel 100 illustrated in FIG. 18 are reversed.

Figure 19:
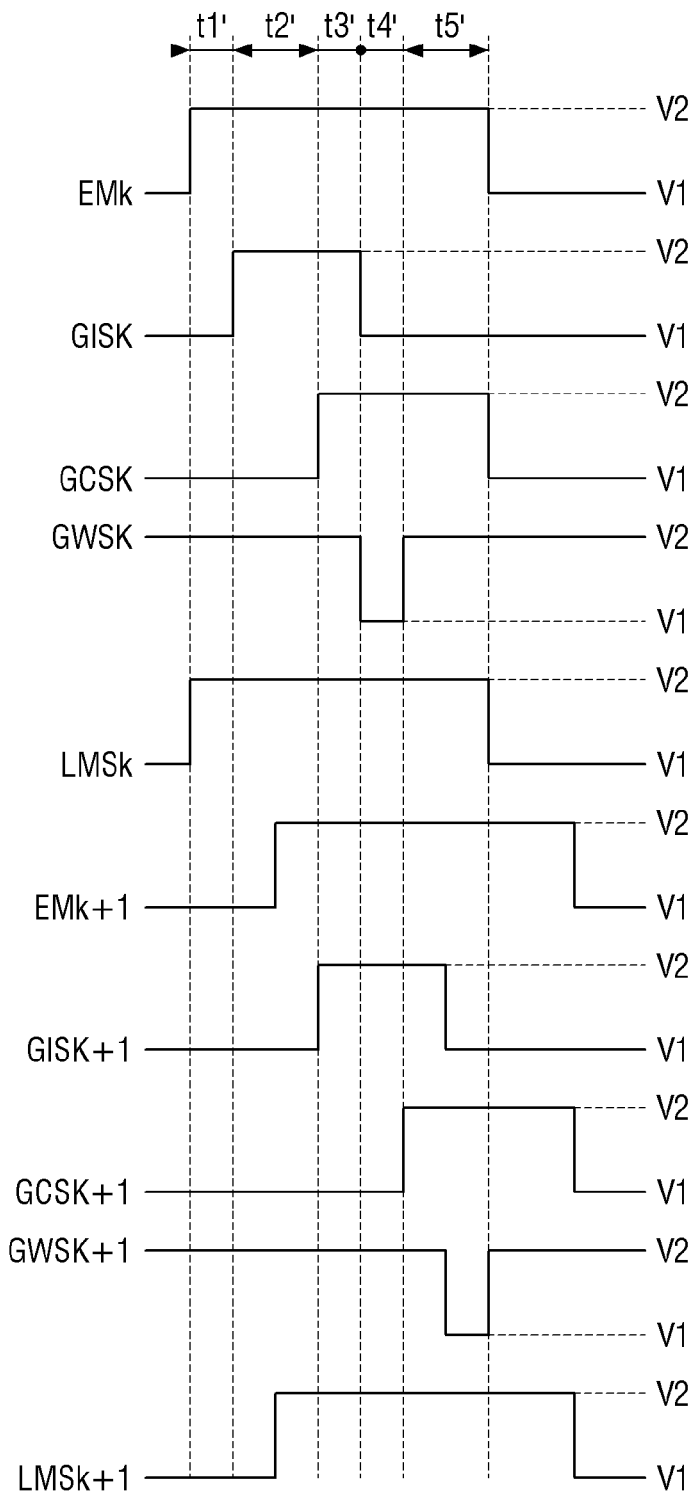
FIG. 19 is a waveform diagram illustrating initialization scan signals, write scan signals, bias scan signals, emission signals, and load matching control signals according to an embodiment.

FIG. 19 is a waveform diagram illustrating initialization scan signals, write scan signals, bias scan signals, emission signals, and load matching control signals according to an embodiment.

An embodiment of FIG. 19 may be different from an embodiment of FIG. 14 in that a pulse of a kth load matching control signal LMSk and a pulse of a kth emission signal EMk are generated during the same period, and a pulse width of the kth load matching control signal LMSk may be substantially equal to a pulse width of the kth emission signal EMk.

Referring to FIG. 19, a first load matching transistor LMT1 to which the kth load matching control signal LMSk is transmitted may be electrically connected to a kth write scan line GWLk to which a kth write scan signal GWSk is transmitted. A pulse of the kth write scan line GWLk may completely overlap the pulse of the kth load matching control signal LMSk. For example, a pulse width of the kth write scan line GWLk may be smaller than the pulse width of the kth load matching control signal LMSk. Therefore, during a period in which the kth write scan signal GWSk of a first-level voltage V1 is transmitted, the first load matching transistor LMT1 electrically connected to the kth write scan line GWLk may be turned on. Thus, during the period in which the kth write scan signal GWSk of the first-level voltage V1 is transmitted, the kth write scan line GWLk may be electrically connected to the first dummy pixels DPX1 through the first common connection line CSL1.

Here, since the pulse of the kth load matching control signal LMSk also overlaps a pulse of a (k+1)th write scan line GWSk+1 and a pulse of a (k+2)th write scan line, if the first load matching transistor LMT1 electrically connected to the kth write scan line GWLk, a second load matching transistor LMT2 electrically connected to the (k+1)th write scan line, and a third load matching transistor LMT3 electrically connected to the (k+2)th write scan line may be electrically connected to the same common scan line, the kth write scan line GWLk, the (k+1)th write scan line and the (k+2)th write scan line may be electrically connected to dummy pixels of the same common scan line. In this case, a load applied to the kth write scan line GWLk may be a third of a load applied to the subpixels PX and a load applied to the dummy pixels DPX.

To prevent the load applied to the dummy pixels DPX from being reduced to a third, as illustrated in FIG. 18, the kth write scan line GWLk may be electrically connected to the first common scan line CSL1 electrically connected to the first dummy pixels DPX1 through the first load matching transistor LMT1, the (k+1)th write scan line may be electrically connected to the second common scan line CSL2 electrically connected to the second dummy pixels DPX2 through the second load matching transistor LMT2, and the (k+2)th write scan line may be electrically connected to the third common scan line CSL3 electrically connected to the third dummy pixels DPX3 through the third load matching transistor LMT3. For example, the kth write scan line GWLk, the (k+1)th write scan line, and the (k+2)th write scan line may be electrically connected to different common scan lines.

In a display device according to an embodiment, load matching transistors electrically connected to scan lines of a second display area protruding from a first display area may be sequentially turned on by load matching control signals of a load matching driving circuit. Therefore, the scan lines of the second display area may be sequentially electrically connected to dummy pixels electrically connected to a common scan line. Hence, a load applied to the scan lines may include not only a load applied to subpixels of the second display area but also a load applied to the dummy pixels. Accordingly, a difference between the load applied to the scan lines in the second display area and the load applied to scan lines in the first display area may be minimized. This may reduce a difference between pulse widths of scan signals of the scan lines of the second display area and pulse widths of scan signals of the scan lines of the first display area, thereby preventing a difference in luminance between the subpixels.

In a display device according to an embodiment, the dummy pixels may be sequentially electrically connected to the scan lines through the common scan line by using the load matching driving circuit and the load matching transistors. For example, since the scan lines share the dummy pixels for compensating for a load, the area of a non-display area may be reduced more than when a load difference between the scan lines is reduced using compensation capacitors.

Although embodiments and implementations have been described herein, other embodiments and modifications will be apparent from this description. Accordingly, the disclosure is not limited to such embodiments, but rather to the broader scope of the appended claims and various obvious modifications and equivalent arrangements as would be apparent to a person of ordinary skill in the art.

What is claimed is:

1. A display device comprising:
a display panel including:
a first display area;
a second display area protruding in a first direction from the first display area; and
a first non-display area adjacent to a side of the second display area,
wherein each of the first display area and the second display area comprises:
subpixels that display an image; and
scan lines electrically connected to the subpixels, and
wherein the first non-display area comprises:
dummy pixels;
a common scan line commonly and directly connected to the dummy pixels;
load matching switch elements respectively disposed between the scan lines and the common scan line; and
a load matching driving circuit that outputs load matching control signals, the load matching driving circuit controlling turn-on and turn-off of the load matching switch elements.

2. The display device of claim 1, wherein an area of the second display area is smaller than an area of the first display area.

3. The display device of claim 1, wherein each of the load matching switch elements comprises:
a gate electrode electrically connected to one of load matching control lines to which the load matching control signals are output;
a first electrode electrically connected to one of the scan lines; and
a second electrode electrically connected to the common scan line.

4. The display device of claim 1, wherein
the display panel further comprises a second non-display area adjacent to another side of the second display area, and
the second non-display area comprises a scan driving circuit that outputs scan signals to the scan lines.

5. The display device of claim 4, wherein the scan signals and the load matching control signals are sequentially output.

6. The display device of claim 4, wherein the scan signals and the load matching control signals are output in synchronization with each other.

7. The display device of claim 4, wherein a pulse width of one of the scan signals is substantially same as a pulse width of one of the load matching control signals.

8. The display device of claim 7, further comprising:
a display driver that outputs a scan start signal and scan clock signals to the scan driving circuit and outputs a load matching start signal and load matching clock signals to the load matching driving circuit, wherein
the scan driving circuit outputs the scan signals in response to the scan start signal and the scan clock signals,
the load matching driving circuit outputs the load matching control signals in response to the load matching start signal and the load matching clock signals, and
the scan clock signals and the load matching clock signals are substantially same.

9. The display device of claim 8, wherein the scan start signal and the load matching start signal are different.

10. The display device of claim 4, wherein a pulse width of one of the scan signals is smaller than a pulse width of one of the load matching control signals.

11. The display device of claim 10, further comprising:
a display driver that outputs a scan start signal and scan clock signals to the scan driving circuit and outputs a load matching start signal and load matching clock signals to the load matching driving circuit, wherein
the scan driving circuit outputs the scan signals in response to the scan start signal and the scan clock signals,
the load matching driving circuit outputs the load matching control signals in response to the load matching start signal and the load matching clock signals, and
the scan clock signals and the load matching clock signals are different.

12. The display device of claim 11, wherein the scan start signal and the load matching start signal are different.

13. A display device comprising:
a display panel including:
a first display area;
a second display area protruding in a first direction from the first display area; and
a first non-display area adjacent to a side of the second display area,
wherein each of the first display area and the second display area comprises:
subpixels that display an image; and
scan lines and emission lines electrically connected to the subpixels, and
wherein the first non-display area comprises:
first dummy pixels and second dummy pixels;
a first common scan line electrically and directly connected to the first dummy pixels;
a second common scan line electrically connected to the second dummy pixels;
first load matching switch elements respectively disposed between a predetermined number of the scan lines and the first common scan line;
second load matching switch elements respectively disposed between other ones of the scan lines and the second common scan line; and
a load matching driving circuit that outputs load matching control signals, the load matching driving circuit controlling turn-on and turn-off of the first load matching switch elements and the second load matching switch elements,
wherein the first dummy pixels are sequentially electrically connected to the scan lines through the first common scan line and the second dummy pixels are sequentially electrically connected to the scan lines through the second common scan line.

14. The display device of claim 13, wherein a first load matching switch element and a second load matching switch element adjacent to each other among the first load matching switch elements and the second load matching switch elements are electrically connected to one of load matching control lines to which the load matching control signals are output.

15. The display device of claim 13, wherein
the display panel further comprises a second non-display area adjacent to another side of the second display area, and
the second non-display area comprises:
a scan driving circuit that outputs scan signals to the scan lines; and
an emission driving circuit that outputs emission signals to the emission lines.

16. The display device of claim 15, wherein the scan signals, the emission signals, and the load matching control signals are sequentially output.

17. The display device of claim 15, wherein the emission signals and the load matching control signals are output in synchronization with each other.

18. The display device of claim 15, wherein a pulse width of one of the emission signals is substantially same as a pulse width of one of the load matching control signals.

19. The display device of claim 18, further comprising:
a display driver that outputs an emission start signal and emission clock signals to the emission driving circuit and outputs a load matching start signal and load matching clock signals to the load matching driving circuit, wherein
the emission driving circuit outputs the emission signals in response to the emission start signal and the emission clock signals,
the load matching driving circuit outputs the load matching control signals in response to the load matching start signal and the load matching clock signals, and
the emission clock signals and the load matching clock signals are substantially same.

20. The display device of claim 19, wherein the emission start signal and the load matching start signal are different.

* * * * *